(12) United States Patent
Lee et al.

(10) Patent No.: US 10,897,126 B2
(45) Date of Patent: Jan. 19, 2021

(54) CHARGE CABINET AND STORAGE DEVICE THEREOF

(71) Applicant: AVER INFORMATION INC., New Taipei (TW)

(72) Inventors: Chun-Hung Lee, New Taipei (TW); Yi-Cheng Chien, New Taipei (TW)

(73) Assignee: AVER INFORMATION INC., New Taipei (TW)

( * ) Notice: Subject to any disclaimer, the term of this patent is extended or adjusted under 35 U.S.C. 154(b) by 224 days.

(21) Appl. No.: 16/225,905

(22) Filed: Dec. 19, 2018

(65) Prior Publication Data

US 2019/0123535 A1 Apr. 25, 2019

Related U.S. Application Data

(63) Continuation-in-part of application No. 15/097,863, filed on Apr. 13, 2016, now Pat. No. 10,424,949.

(30) Foreign Application Priority Data

Nov. 27, 2015 (TW) .............................. 104139705 A
Mar. 16, 2018 (TW) .............................. 107109008 A

(51) Int. Cl.
*H02G 3/08* (2006.01)
*H05K 5/02* (2006.01)
*H02J 7/00* (2006.01)
*H05K 7/14* (2006.01)

(52) U.S. Cl.
CPC ............ *H02G 3/081* (2013.01); *H02J 7/0027* (2013.01); *H02J 7/0044* (2013.01); *H05K 5/0247* (2013.01); *H05K 7/1491* (2013.01)

(58) Field of Classification Search
CPC .......... H02J 7/0027; H02J 7/0044; H02J 7/00; A47B 81/00; A47B 96/04; A47B 97/00;
(Continued)

(56) References Cited

U.S. PATENT DOCUMENTS

2003/0190036 A1* 10/2003 Mandoza ............... H04Q 1/068
379/327
2004/0012921 A1* 1/2004 Hidaka ................ G11B 33/022
361/679.32
(Continued)

*Primary Examiner* — Richard Isla
*Assistant Examiner* — Dung V Bui
(74) *Attorney, Agent, or Firm* — Maschoff Brennan

(57) ABSTRACT

A storage device includes a base and a plurality of wire management modules. Each of the wire management modules includes a partition and a pivotal member. The partition is disposed to the base and has a supporting surface and a wire management groove. The supporting surface is located at the partition. The wire management groove is located at the supporting surface for accommodating wire. The pivotal member includes a fastening part and a pivotal part. The pivotal part is pivoted on the partition for a fastening position and a releasing position. When the pivotal member is at the fastening position, the fastening part covers the supporting surface for fastening wire between the surface and the fastening part. When the pivotal member is at the releasing position, the fastening part is spaced apart from the surface for releasing wire. The partitions and the base together form accommodation spaces.

11 Claims, 20 Drawing Sheets

(58) Field of Classification Search
CPC ...... A47B 57/588; A47B 57/58; B65D 25/04; B65D 25/06; B65D 5/48; B65D 5/48024; B65D 85/04; B65D 73/02; G02B 6/4439; G02B 6/444; G02B 6/4441; G02B 6/4442; G02B 6/4444; G02B 6/4445; G02B 6/4446; G02B 6/4447; G02B 6/4448; G02B 6/445; G02B 6/4451; G02B 6/4452; H05K 5/0247; H05K 5/02; H05K 7/1417; H05K 7/1447; H05K 7/1448; H05K 7/1449; H05K 7/1451; H05K 7/1491; H05K 7/14; H02G 3/081; H02G 3/08
USPC ........ 320/107; 220/532, 533, 534, 549, 550, 220/529; 206/576, 320, 701, 702, 722, 206/725, 726; 312/223.6; 385/135; 211/183, 184; 108/60, 61
See application file for complete search history.

(56) References Cited

U.S. PATENT DOCUMENTS

| | | | |
|---|---|---|---|
| 2012/0229967 A1* | 9/2012 | Zhou | H01R 13/72 361/679.01 |
| 2013/0063073 A1* | 3/2013 | Kawasaki | H02J 7/0045 320/101 |
| 2013/0288096 A1* | 10/2013 | Frutschy | H01M 2/1094 429/99 |
| 2014/0327336 A1* | 11/2014 | Ewert | H02K 3/522 310/215 |
| 2015/0061571 A1* | 3/2015 | Lin | H02J 7/0044 320/107 |
| 2015/0325818 A1* | 11/2015 | Suzuki | H01M 2/024 429/159 |
| 2016/0134140 A1* | 5/2016 | Tittle | H02J 1/08 320/101 |

* cited by examiner

CHARGE CABINET AND STORAGE DEVICE THEREOF

CROSS-REFERENCE TO RELATED APPLICATIONS

This non-provisional application claims priority under 35 U.S.C. § 119(a) on Patent Application No(s). 107109008 filed in Taiwan, R.O.C. on Mar. 16, 2018, this application is a continuation-in-part of U.S. patent application Ser. No. 15/097,863, filed Apr. 13, 2016, which claims priority under 35 U.S.C. § 119(a) on Patent Application No(s). 104139705 filed in China on Nov. 27, 2015, the entire contents of which are hereby incorporated by reference.

TECHNICAL FIELD

The present disclosure provides a storage device and a charge cabinet, more particularly to a storage device having a wire management structure and a charge cabinet having the storage device.

BACKGROUND

Since mobile electronic devices have many advantages such as being highly portable, simple to operate, highly entertaining, excellent extension capabilities and excellent display capabilities, many education institutions use mobile electronic devices as multimedia devices for educating students. Generally, educational institutions purchase the mobile electronic devices and the charging cabinets at the same time. The charging cabinet is used for storing and charging the mobile electronic devices.

SUMMARY

According to the disclosure, a storage device includes a base and a plurality of wire management modules. Each of the wire management modules includes a partition and a pivotal member. The partition is disposed to the base and has a supporting surface and a wire management groove. The supporting surface is located at a side of the partition away from the base. The wire management groove is located at the supporting surface, and the wire management groove is for accommodating wire. The pivotal member includes a fastening part and a pivotal part connected to each other. The pivotal part is pivoted on the partition, and the pivot member has a fastening position and a releasing position. When the pivotal member is at the fastening position, the fastening part covers a part of the supporting surface for fastening a part of wire between the supporting surface and the fastening part. When the pivotal member is at the releasing position, the fastening part is spaced apart from the supporting surface for releasing wire. The partitions of the plurality of wire management modules and the base together form a plurality of accommodation spaces.

According to the disclosure, a storage device includes a base and a wire management module. The wire management module includes a partition and a pivotal member. The partition is disposed to the base and includes a partitioning member and a fixing structure connected to each other. The partitioning member and the base together define a plurality of accommodation spaces. A supporting surface of the partitioning member is located at a side of the partitioning member away from the base. The pivotal member includes a fastening part, a pivotal part and a fixing part connected to each other. The pivotal part is pivoted on the partitioning member, and the fixing part corresponds to the fixing structure. The pivotal member is rotatable with respect to the partition to be at either a fastening position or a releasing position. when the pivotal member is in the fastening position, the fastening part covers a part of the supporting surface and defines a wire management space, the fixing part of the pivotal member is located between the fixing structure and the partitioning member of the partition, and the fixing part is fixed to the fixing structure so as to maintain the pivotal member in the fastening position; when the pivotal member is in the releasing position, the fastening part and the supporting surface are spaced apart from each other, and the fixing part is released from the fixing structure of the partition.

According to the disclosure, a storage device includes a base and a wire management module. The wire management module includes a partition and at least one pivotal member. The partition is disposed to the base. The partition and the base together define a plurality of accommodation spaces. A supporting surface of the partition is located at a side of the partition away from the base, and a first bump of the partition is located on the supporting surface. The at least one pivotal member includes a fastening part and a pivotal part connected to each other. The pivotal part is pivoted on the partition. A second bump of the fastening part is located at a side of the fastening part close to the supporting surface. The at least one pivotal member is rotatable with respect to the partition to be at either a fastening position or a releasing position. when the at least one pivotal member is in the fastening position, the fastening part covers a part of the supporting surface and defines a wire management space, the first bump and the second bump are located in the wire management space, and the first bump and the second bump are in staggered arrangement along an extension direction of the supporting surface; when the at least one pivotal member is in the releasing position, the fastening part and the supporting surface are spaced apart from each other.

According to the disclosure, a charge cabinet includes a case, a power supply, a plurality of wires and the aforementioned storage device. The power supply is disposed to the case. The wires are electrically connected to the power supply. The storage device is disposed in the case.

BRIEF DESCRIPTION OF THE DRAWINGS

The present invention will become more understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
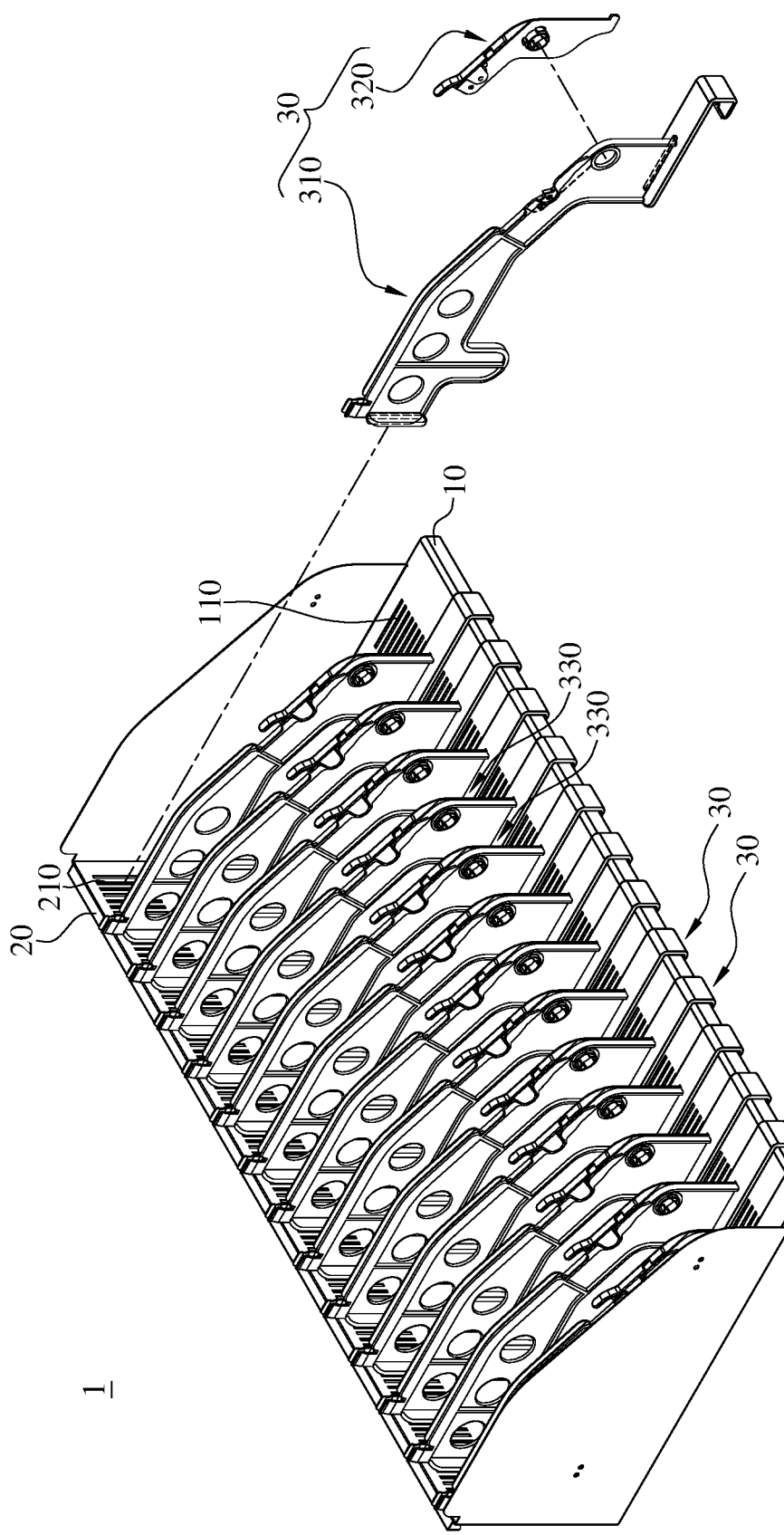
FIG. 1 is an exploded view of a storage device according to a first embodiment.
Figure 2:
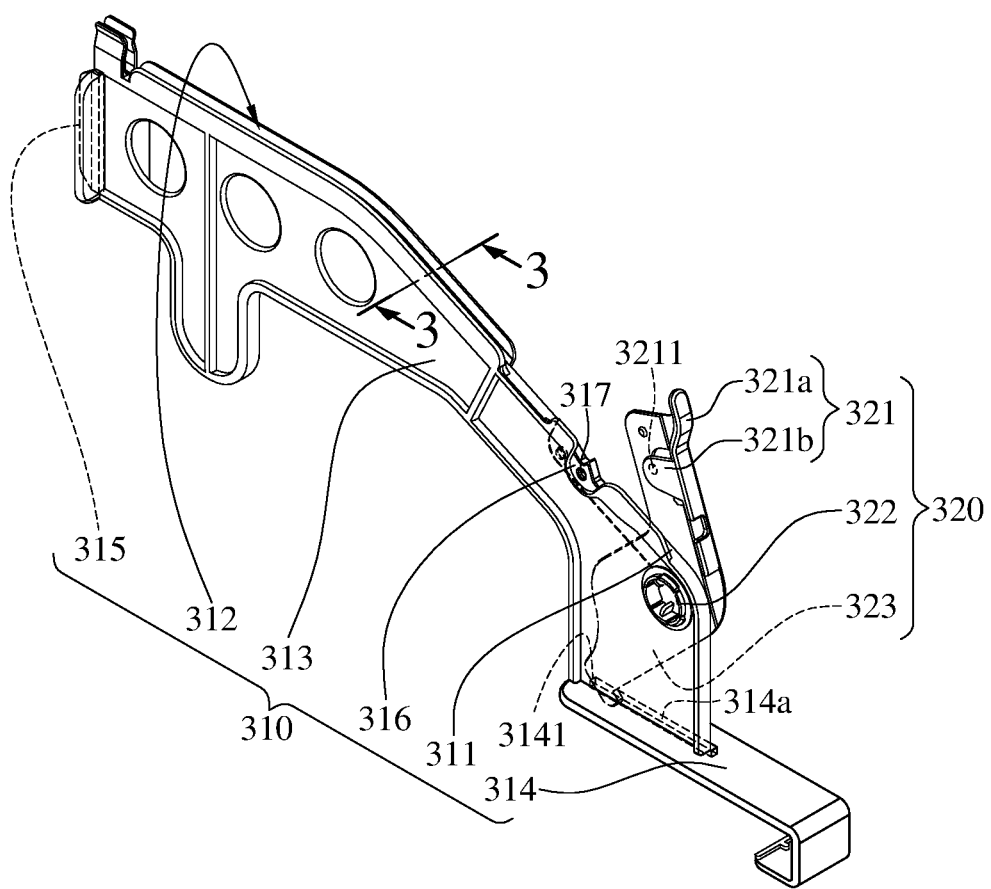
FIG. 2 is a perspective view of the wire management module in FIG. 1.
Figure 3:
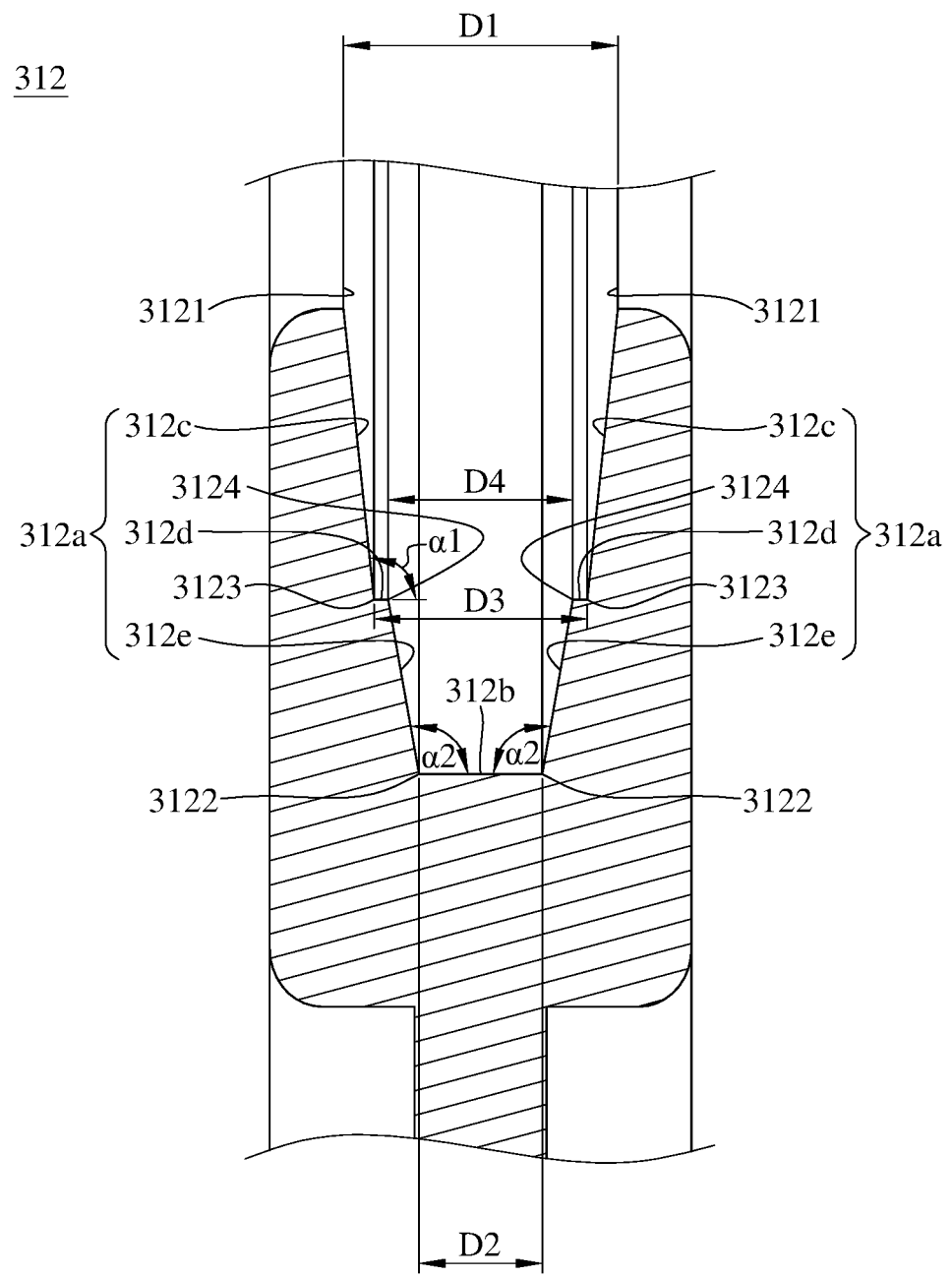
FIG. 3 is a partial cross-sectional view of the wire management module in FIG. 2 along a line 3-3.
Figure 4:
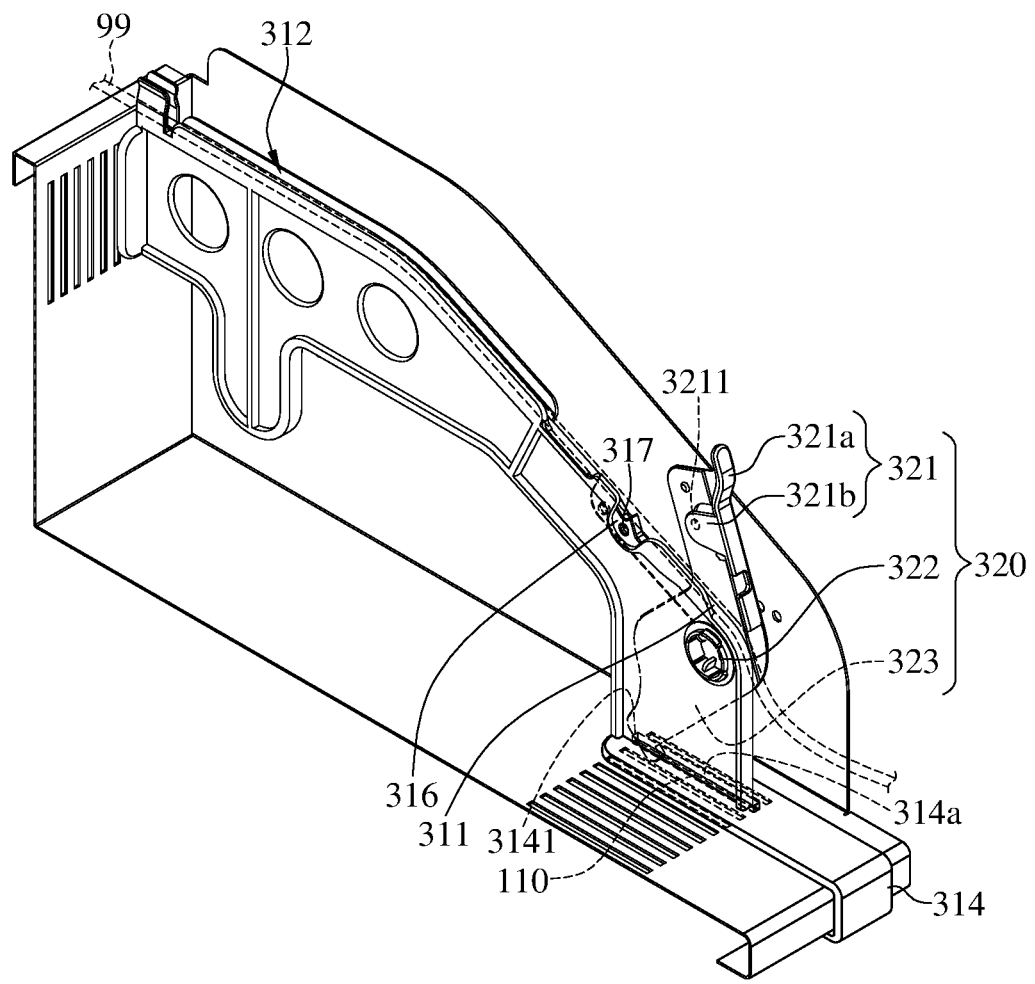
FIG. 4 is a perspective view of the wire management module in FIG. 1 with a pivotal member at a releasing position.
Figure 5:
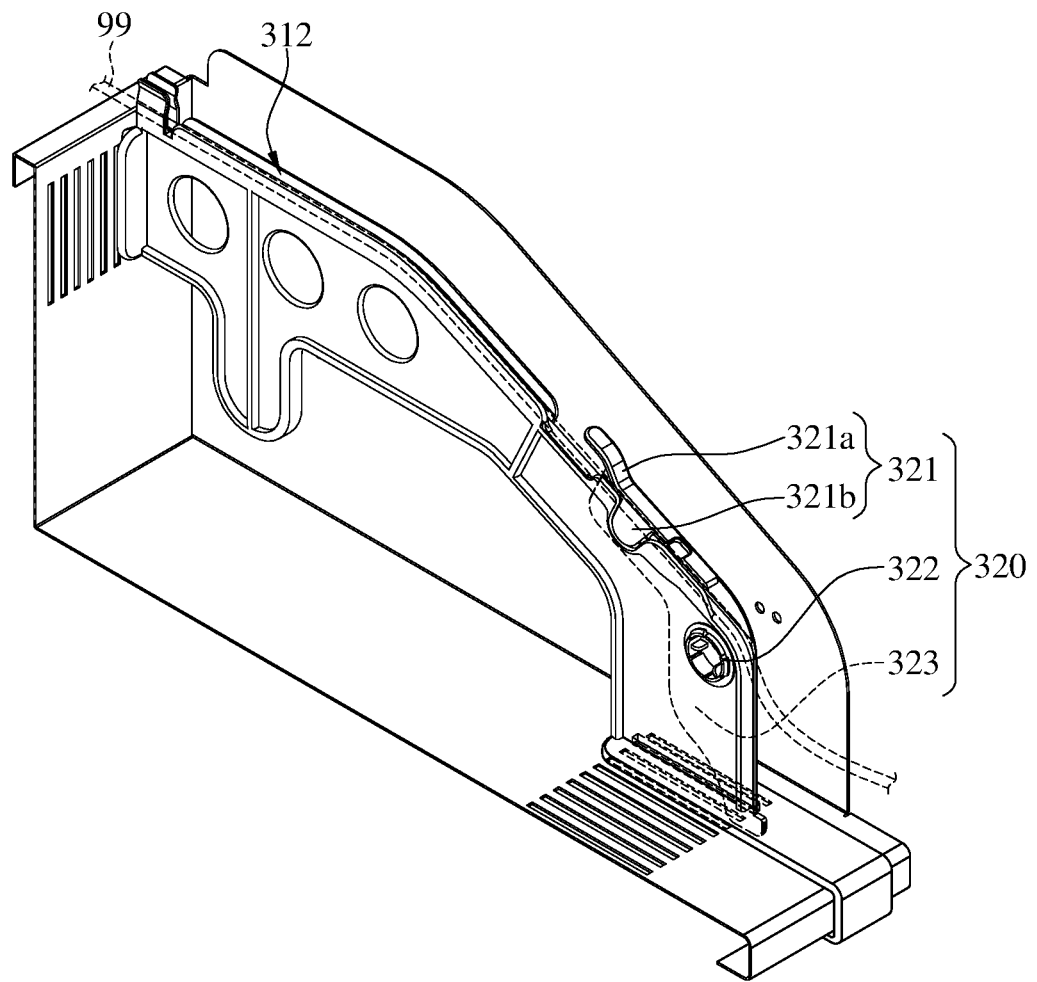
FIG. 5 is a perspective view of the wire management module in FIG. 4 with the pivotal member at a fastening position.

Please refer to FIG. 1 to FIG. 5. FIG. 1 is an exploded view of a storage device according to a first embodiment. FIG. 2 is a perspective view of the wire management module in FIG. 1. FIG. 3 is a partial cross-sectional view of the wire management module in FIG. 2 along a line 3-3. FIG. 4 is a perspective view of the wire management module in FIG. 1 with a pivotal member at a releasing position. FIG. 5 is a perspective view of the wire management module in FIG. 4 with the pivotal member at a fastening position. In this embodiment, the storage device 1 includes a base 10, a board 20 and a plurality of wire management modules 30.

The base 10, for example, can be a frame made of metal or plastic, and the base 10 can have a plurality of slits 110. The board 20 stands on the base 10, and the board 20 can have a plurality of fastening holes 210.

Each of the wire management modules 30 includes a partition 310 and a pivotal member 320. The partition 310 is disposed to the base 10. The partitions 310 of the wire management modules 30 and the base 10 together form a plurality of accommodation spaces 330. Each of the accommodation spaces 330 can be used for accommodating a mobile electronic device such as a tablet, laptop or a smart phone. Each of the partitions 310 has a supporting surface 311 and a wire management groove 312 for accommodating a wire. The supporting surface 311 is located at a side of the partition 310 away from the base 10, and the wire management groove 312 is located at the supporting surface 311. In this embodiment, both the supporting surface 311 and the wire management groove 312 are located at the top of the partition 310 for obtaining a larger accommodation space 330, but the disclosure is not limited thereto. In other embodiments, both the supporting surface and the wire management groove can be located at a side of the partition facing the accommodation space. Furthermore, the wire management groove 312 is formed on a part of the supporting surface 311 in this embodiment, but the disclosure is not limited thereto. In other embodiments, the wire management groove can be formed on all parts of the supporting surface 311.

The wire management groove 312 has two side surfaces 312a opposite to each other and a bottom surface 312b. Each of the two side surfaces 312a has a first edge 3121 and a second edge 3122 that are opposite to each other. The two second edges 3122 are respectively connected to two opposite sides of the bottom surface 312b. The distance D2 between the two second edges 3122 can be less than the distance D1 between the two first edges 3121. In detail, each of the two side surfaces 312a can have a first limiting section 312c, a supporting section 312d and a second limiting section 312e which may be connected in sequence. The supporting section 312d is located between the first limiting section 312c and the second limiting section 312e. The first edge 3121 is the edge of the first limiting section 312c away from the supporting section 312d, and the second edge 3122 is the edge of the second limiting section 312e away from the supporting section 312d. The supporting section 312d has a side 3123 close to the first limiting section 312c and a side 3124 close to the second limiting section 312e. The distance D3 between the two sides 3123 can be greater than the distance D4 between the two sides 3124. Therefore, a space formed by the two first limiting sections 312c and the two supporting sections 312d is favorable for accommodating the wire having larger diameter, and a space formed by the two second limiting sections 312e and the bottom surface 312b is favorable for accommodating the wire having a smaller diameter, and thereby the wire management groove 312 is applicable to accommodate different wires having different diameters. For example, the wire management groove 312 can accommodate two wires having different diameters simultaneously or can alternatively accommodate one of the two wires.

The wire management modules 30 are detachably disposed to the base 10 and the board 20. In detail, the partition 310 of the wire management module 30 can include a partitioning member 313, an assembling member 314 and a protrusion 315. The assembling member 314 and the protrusion 315 are connected by the partitioning member 313. Both the supporting surface 311 and the wire management groove 312 are located at the partitioning member 313, and the pivotal member 320 is pivoted on the partitioning member 313. The assembling member 314 is detachably assembled together with an edge of the base 10 away from the board 20, and the protrusion 315 is detachably fastened into the fastening hole 210. Therefore, two different ends of the wire management module 30 are respectively fixed to the base 10 and the board 20 by the assembling member 314 and the protrusion 315.

The pivotal member 320 includes a fastening part 321 and a pivotal part 322 connected to each other, and the pivotal part 322 is pivoted on the partition 310. The pivotal member 320 is rotatable relative to the partition 310 and has a releasing position and a fastening position. Therefore, the wire management groove 312 and the pivotal member 320 are used for positioning and managing the wire. As shown in FIG. 4, when the pivotal member 320 is at the releasing position, the fastening part 321 of the pivotal member 320 is spaced apart from the supporting surface 311 of the partition 310. A user is capable of positioning a wire 99 in or removing the wire 99 from the wire management groove 312. In detail, the wire 99 can be pulled along the supporting surface 311 so as to be positioned into the wire management groove 312, or the wire 99 can be disposed to the supporting surface 311 and into the wire management groove 312 from the top of the partition 310. The wire 99 may be used for charging the electronic device disposed in the accommodation space 330 of the storage device 1.

The pivotal member 320 is rotatable relative to the partition 310 so as to move from the releasing position to the fastening position. As shown in FIG. 5, the fastening part 321 of the pivotal member 320 is close to the partition 310 so as to cover a part of the supporting surface 311 when the pivotal member 320 is at the fastening position. Thus, a part of wire 99 is fastened between the fastening part 321 and the supporting surface 311 of the partition 310. In detail, as shown in FIG. 2, the partition 310 can further have an accommodation groove 316 and a positioning hole 317 that are connected to each other. The fastening part 321 of the pivotal member 320 can include a fastening section 321a and a positioning section 321b that are connected to each other. The positioning section 321b extends towards the partition 310, and the positioning section 321b can include a fixing block 3211. When the pivotal member 320 is at the fastening position, a part of the positioning section 321b is located in the accommodation groove 316, and the fixing block 3211 faces the partition 310 and is fastened in the positioning hole 317 so as to keep the pivotal member 320 at the fastening position. The fastening section 321a abuts against the wire 99 so that the wire is securely attached to the supporting surface 311. Therefore, the arrangement of the fixing block 3211 and the positioning hole 317 is favorable for preventing the pivotal member 320 from being away from the fastening position so as to maintain sufficient capability for fastening the wire 99. Moreover, the positioning section 321b is favorable for preventing any deviation between the fastening section 321a and the supporting surface 311 so as to ensure that the pivotal member 320 at the fastening position is properly fasten the wire 99 between the fastening section 321a and the supporting surface 311.

When it is necessary to release the wire 99, the pivotal member 320 is moved from the fastening position to the releasing position. Therefore, the fastening part 321 is away from the supporting surface 311 so that the wire 99 is movable relative to the partition 310, and thereby the user is able to adjust a length of the wire 99 or replace the wire 99 with another wire having a different diameter.

According to the disclosure, a part of the wire 99 is disposed in the wire management groove 312, and a part of the wire 99 is fastened between the pivotal member 320 and the supporting surface 311 of the partition 310. Thus, the position of the wire 99 on the wire management module 30 is fixed by the wire management groove 312 and the pivotal member 320, thereby preventing the wires 99 from becoming tangled and being difficult to plug into the port of the mobile electronic device.

Furthermore, as shown in FIG. 3, the first limiting section 312c and the supporting section 312d of the side surface 312a may have an obtuse angle α1 therebetween, and the second limiting section 312e and the bottom surface 312b may have an obtuse angle α2 therebetween. Therefore, the first limiting section 312c and the second limiting section 312e tilt in relation to the bottom surface 312b whereby a wire may easily be accommodated into the wire management groove 312 from such a larger opening at the top of the wire management groove 312, and may get into position between the two first limiting sections 312c or the two second limiting sections 312e.

In addition, the assembling member 314 of the partition 310 can have a through hole 314a, and the assembling member 314 can further have a blocking section 3141 located at an edge of the through hole 314a close to the board 20. The pivotal member 320 can further include an extension part 323, and the pivotal part 322 of the pivotal member 320 is located between the fastening part 321 and the extension part 323. The extension part 323 is movably disposed in the through hole 314a, and the extension part 323 is separatably abutted against the blocking section 3141 so as to keep the pivotal member 320 at the releasing position. In detail, when the pivotal member 320 is moved from the fastening position to the releasing position, the extension part 323 is abutted against the blocking section 3141 so as to stop the rotation of the pivotal member 320 relative to the partition 310. Thus, the arrangement of the blocking section 3141 and the extension part 323 is favorable for maintaining an angle between the pivotal member 320 and the base 10 when the pivotal member 320 is at the releasing position so that the angles between each of the pivotal members 320 and the base 10 are the same, and thereby it is favorable for providing better overall appearance of the storage device 1. Moreover, the pivotal member 320 is capable of being kept at the releasing position by the blocking section 3141 and the extension part 323 without supported by hand so that the user is able to replace and organize the wire on the supporting surface 311 with two hands. In this embodiment, the extension part 323 can extend into the slit 110 for increasing the area of the extension part 323 abutted against the blocking section 3141.

Figure 6:
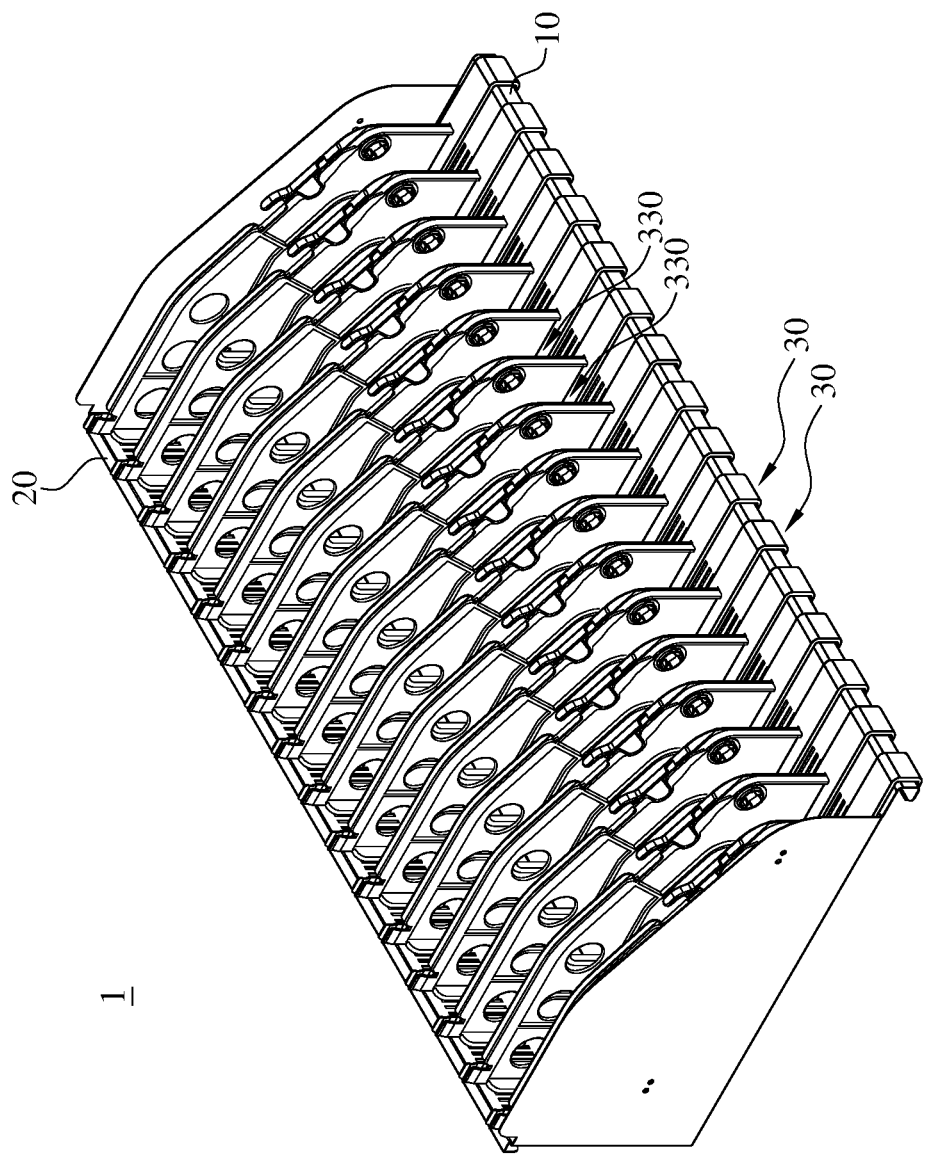
FIG. 6 is a perspective view of the storage device in FIG. 1 with different a quantity of the wire management module.
Figure 7:
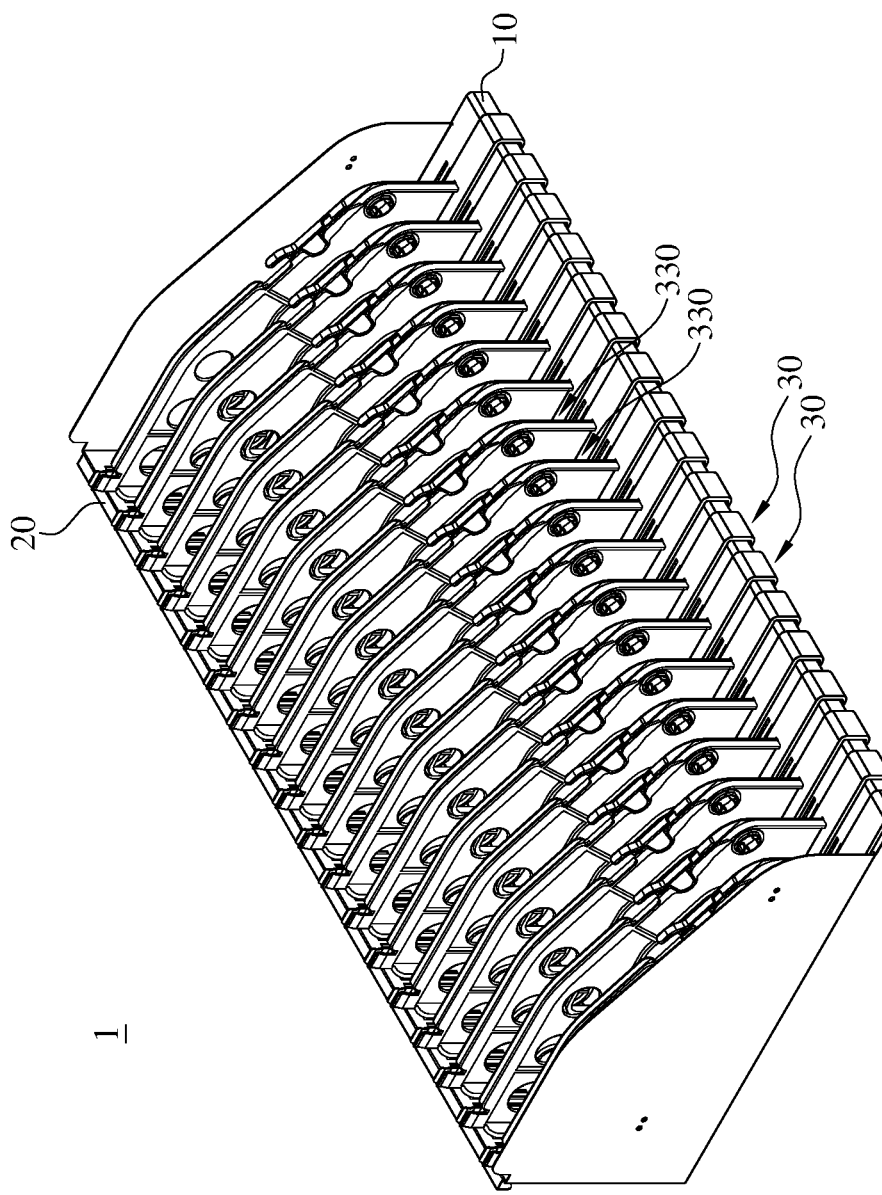
FIG. 7 is a perspective view of the storage device in FIG. 1 with another different quantity of the wire management module.

In this embodiment, the wire management modules 30 are detachably assembled together with the base 10 and the board 20 so that the distance between every two of the wire management modules 30 that are adjacent to each other is adjustable, and the quantity of the wire management module 30 assembled together with the base 10 and the board 20 is also adjustable. Please refer to FIG. 1, FIG. 6 and FIG. 7. FIG. 6 is a perspective view of a storage device in FIG. 1 with different quantity of the wire management module; FIG. 7 is a perspective view of a storage device in FIG. 1 with another different quantity of the wire management module. In FIG. 1, the storage device 1 includes totally thirteen wire management modules 30 so as to form a total of thirteen accommodation spaces 330. When it is necessary to adjust the distance between two adjacent wire management modules 30 or the quantity of the wire management modules 30, some of the management modules 30 or all of the wire management modules 30 are detached from the base 10 and the board 20, and the necessary quantity or distance is decided by the user. Then, the user assembles the wire management modules 30, the base 10 and the board 20 together according to the necessary quantity or distance decided. For example, in FIG. 6, the storage device 1 includes a total of fifteen wire management modules 30 so as to form a total of fifteen accommodation spaces 330, and each of the accommodation spaces 330 is narrower for accommodating thinner electronic devices. In FIG. 7, the storage device 1 includes a total of eighteen wire management modules 30 so as to form a total of eighteen accommodation spaces 330. In this embodiment, the wire management module 30 is detachable from the base 10 and the board 20, but the disclosure is not limited thereto. In other embodiments, the wire management module can be secured to the base and the board (undetachable from the base and the board). In some embodiments, the storage device can include the base without including the board, and the wire management module is detachably or undetachably disposed to the base.

Figure 8:
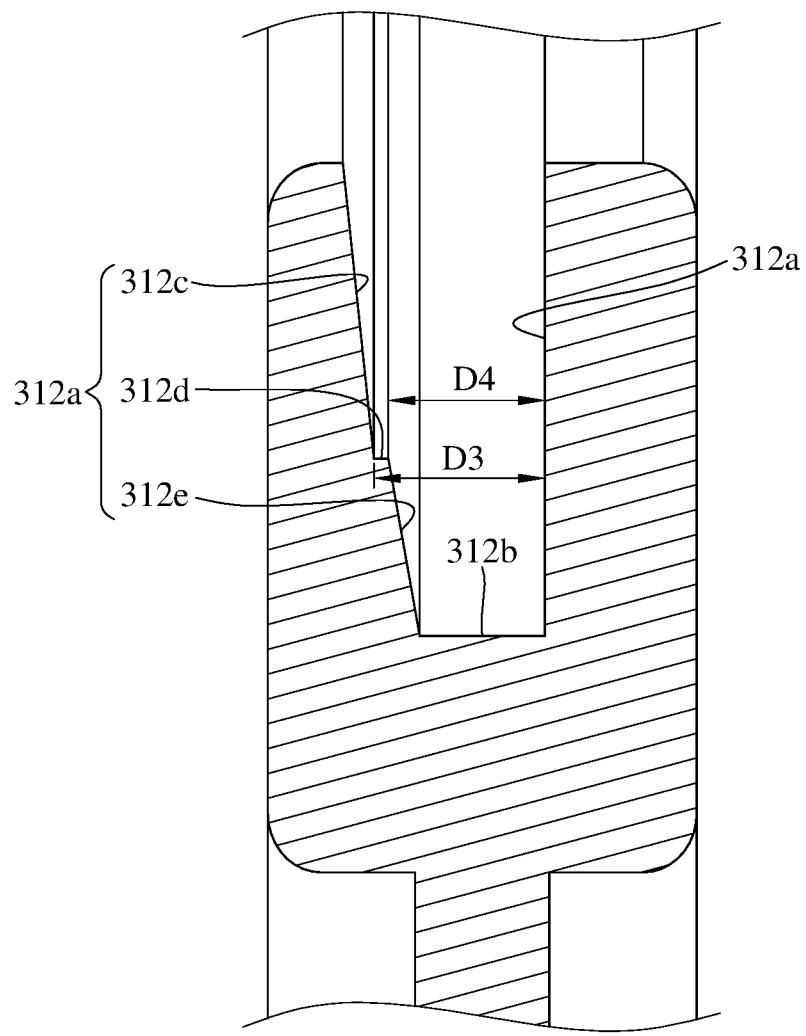
FIG. 8 is a partial cross-sectional view of a storage device according to a second embodiment.

In the first embodiment, both of the two side surfaces of the wire management groove has the limiting sections and the supporting section, but the disclosure is not limited thereto. Please refer to FIG. 8. FIG. 8 is a partial cross-sectional view of a storage device according to a second embodiment. Since the second embodiment is similar to the first embodiment, only the differences will be illustrated hereafter.

In this embodiment, one of the two side surfaces 312a of the wire management groove 312 has the first limiting section 312c, the supporting section 312d and the second limiting section 312e, and the other side surface 312a is smooth. The distance D3 from the side of the supporting section 312d close to the first limiting section 312c to the smooth side surface 312a is greater than the distance D4 from the side of the supporting section 312d close to the second limiting section 312e to the smooth side surface 312a. Therefore, a space formed by the first limiting section 312c, the supporting section 312d and the smooth side surface 312a is favorable for accommodating the wire having a larger diameter, and a space formed by the second limiting section 312e, the bottom surface 312b and the smooth side surface 312a is favorable for accommodating the wire having a smaller diameter.

Figure 9:
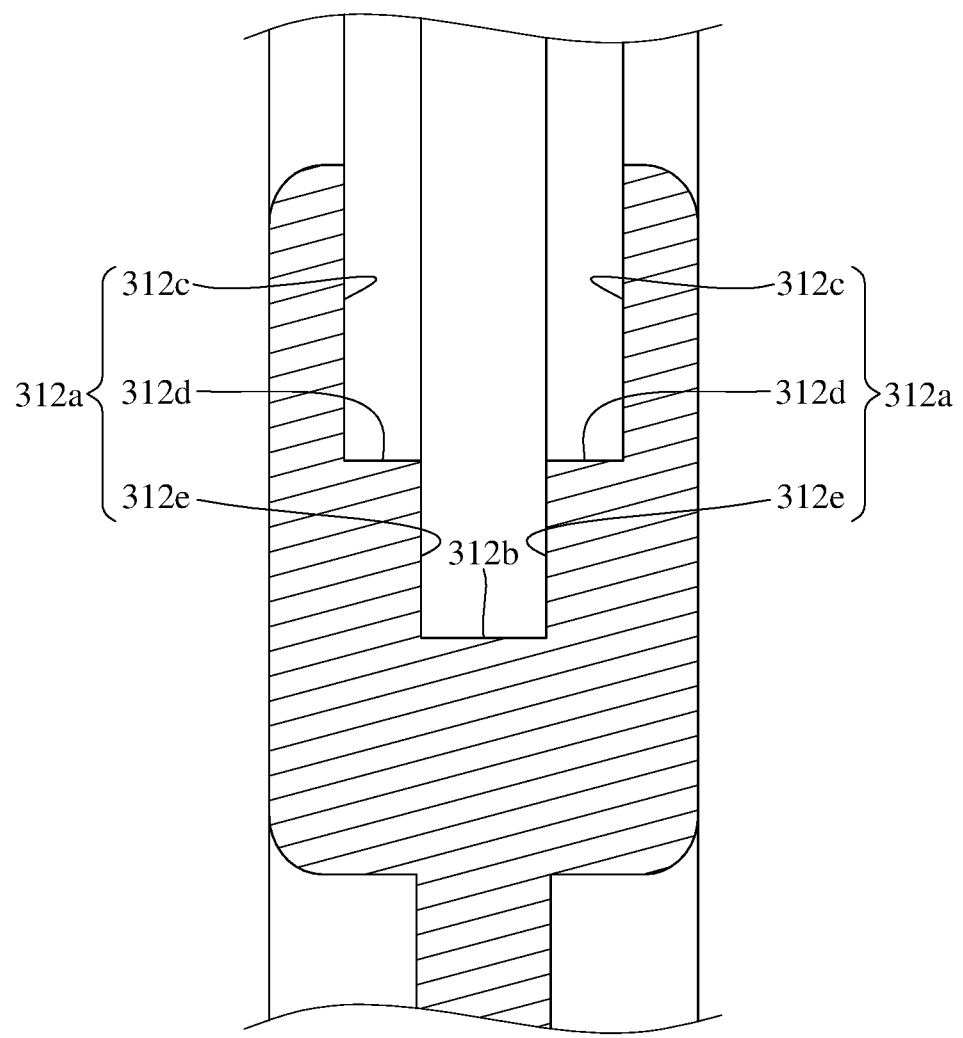
FIG. 9 is a partial cross-sectional view of a storage device according to a third embodiment.

In the first embodiment, there are the obtuse angles between the first limiting section 312c and the supporting section 312d as well as the second limiting section 312e and the bottom surface 312b of the side surface in the wire management groove 312, but the disclosure is not limited thereto. Please refer to FIG. 9. FIG. 9 is a partial cross-sectional view of a storage device according to a third embodiment. Since the third embodiment is similar to the first embodiment, only the differences will be illustrated hereafter. In this embodiment, there is a right angle between the first limiting section 312c and the supporting section 312d, and there is also a right angle between the second limiting section 312e and the bottom surface 312b. That is, the limiting sections 312c, 312e of the side surface 312a are perpendicular to the supporting section 312d and the bottom surface 312b.

Figure 10:
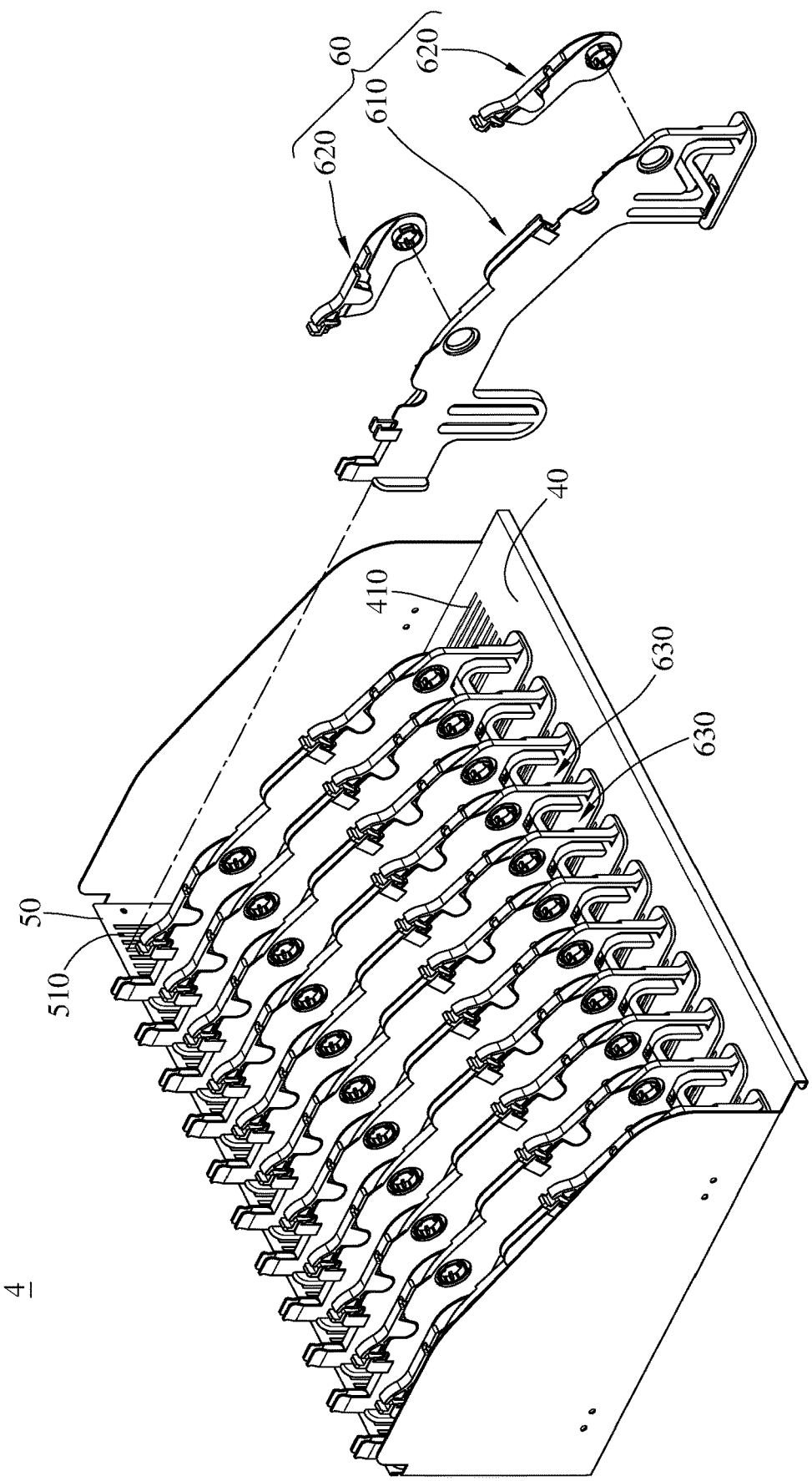
FIG. 10 is an exploded view of a storage device according to a fourth embodiment.
Figure 11:
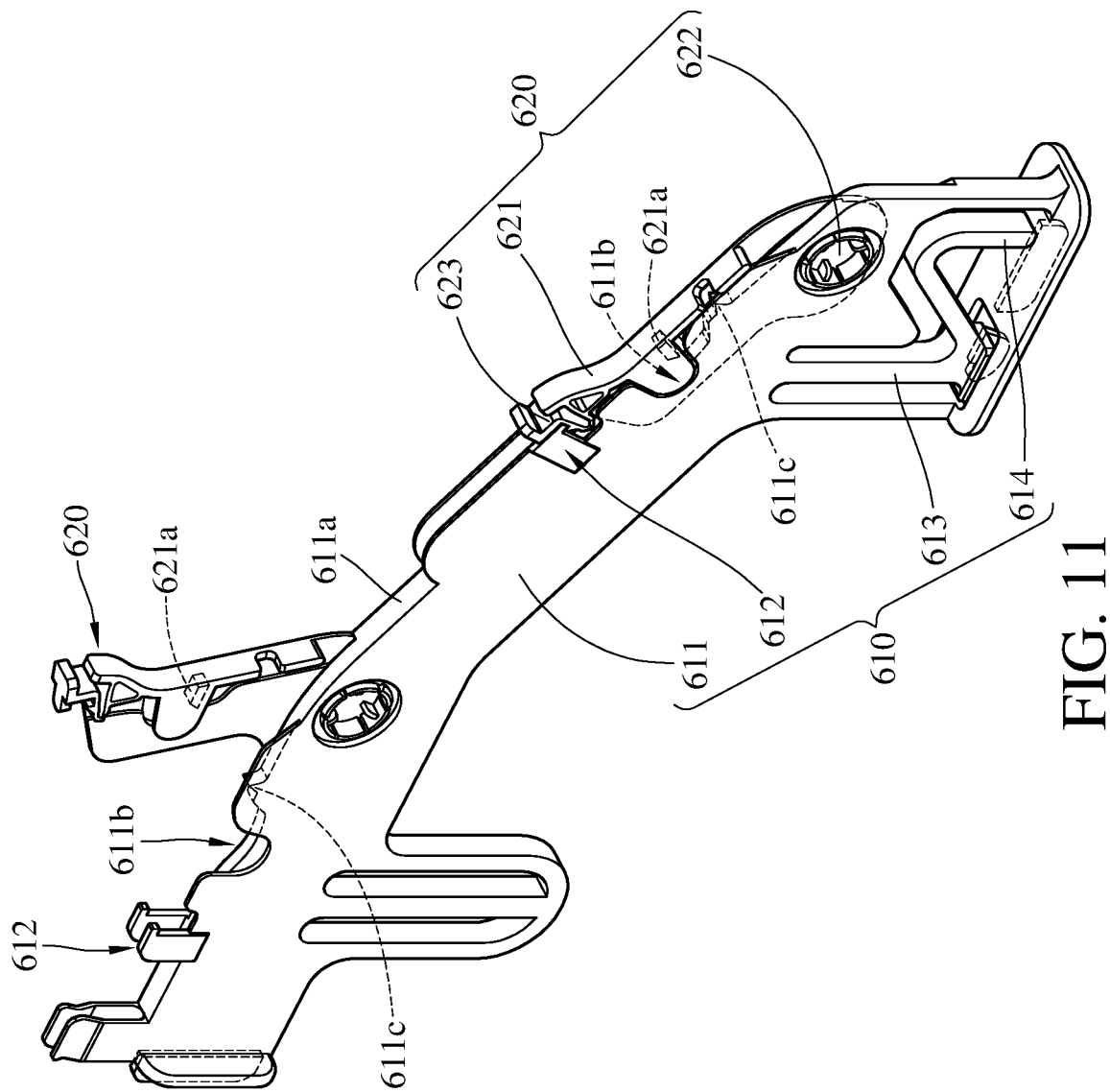
FIG. 11 is a perspective view of the wire management module in FIG. 10.
Figure 12:
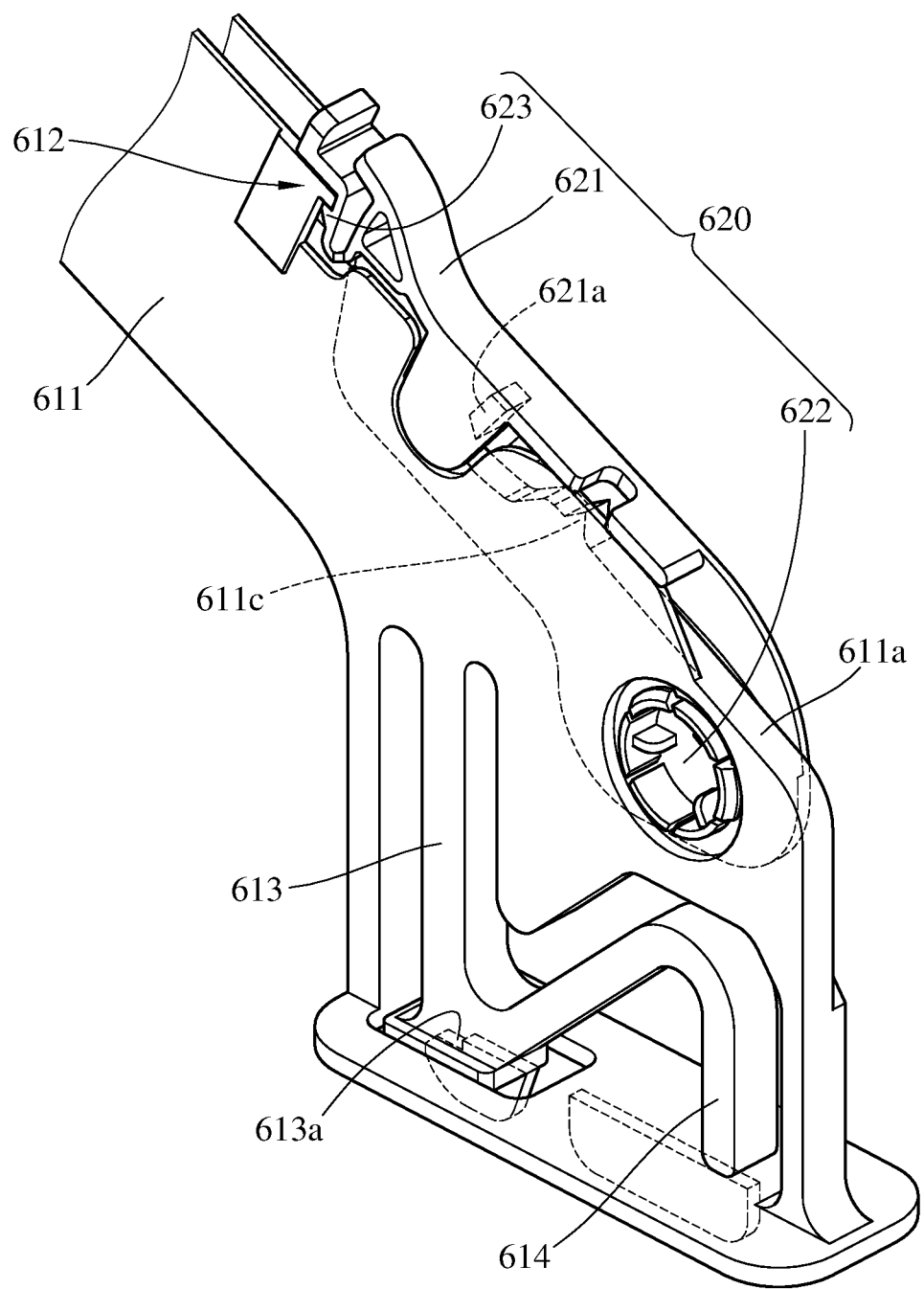
FIG. 12 is a partial perspective view of the wire management module in FIG. 11.

Please refer to FIG. 10 to FIG. 12. FIG. 10 is an exploded view of a storage device according to a fourth embodiment. FIG. 11 is a perspective view of the wire management module in FIG. 10. FIG. 12 is a partial perspective view of the wire management module in FIG. 11. In this embodiment, a storage device 4 includes a base 40, a board 50 and a plurality of wire management modules 60. The quantity of the wire management modules 60 of this embodiment is not limited in the disclosure.

Both of the base 40 and the board 50 are, for example, metal or plastic plates. The base 40 can have a plurality of slits 410. The board 50 stands on the base 40 and can have a plurality of fastening holes 510.

Each of the wire management module 60 includes a partition 610 and two pivotal members 620. The partition 610 is disposed to the base 40. The partitions 610 and the base 40 together defines a plurality of accommodation spaces 630. Each of the accommodation space 630 can be used to for accommodating a mobile electronic device such as a tablet, a laptop computer or a smartphone. The quantity of the pivotal member 620 is not limited in the disclosure.

The partition 610 includes a partitioning member 611, two fixing structures 612, an assembling member 613 and a holder 614 connected to each other. A supporting surface 611a, two recesses 611b and two first bumps 611c of the partitioning member 611 are all located at a side of the partition 610 away from the base 40. The fixing structures 612 respectively extend from two sides of the supporting surface 611a along a direction away from the supporting surface 611a, and the recesses 611b and the first bumps 611c are all located on the supporting surface 611a. In detail, the supporting surface 611a, the recesses 611b, the first bumps 611c and the fixing structures 612 are all located at the top of the partitioning member 611 for obtaining a larger accommodation space 630.

The assembling member 613 is movably connected to the partitioning member 611 and has an assembling slot 613a. The holder 614 and the assembling slot 613a are respectively located on two sides of the assembling member 613 opposite to each other, and the holder 614 is connected to the assembling member 613 such that the holder 614 is movable with respect to the partitioning member 611 through the assembling member 613. The partition 610 is fixed to the base 40 through the assembling slot 613a of the assembling member 613, and the detail description will be illustrated hereinafter.

Each of the pivotal members 620 includes a fastening part 621, a pivotal part 622 and a fixing part 623 connected to each other, and the fastening part 621 is located between the pivotal part 622 and the fixing part 623. In each of the fastening parts 621, a second bump 621a of the fastening part 621 is located at a side of the fastening part 621 close to the supporting surface 611a of the partitioning member 611. The pivotal part 622 is pivoted on the partitioning member 611 so as to make the pivotal member 620 rotatable with respect to the partition 610. The fixing parts 623 respectively correspond to the fixing structures 612 of the partition 610.

Figure 13:
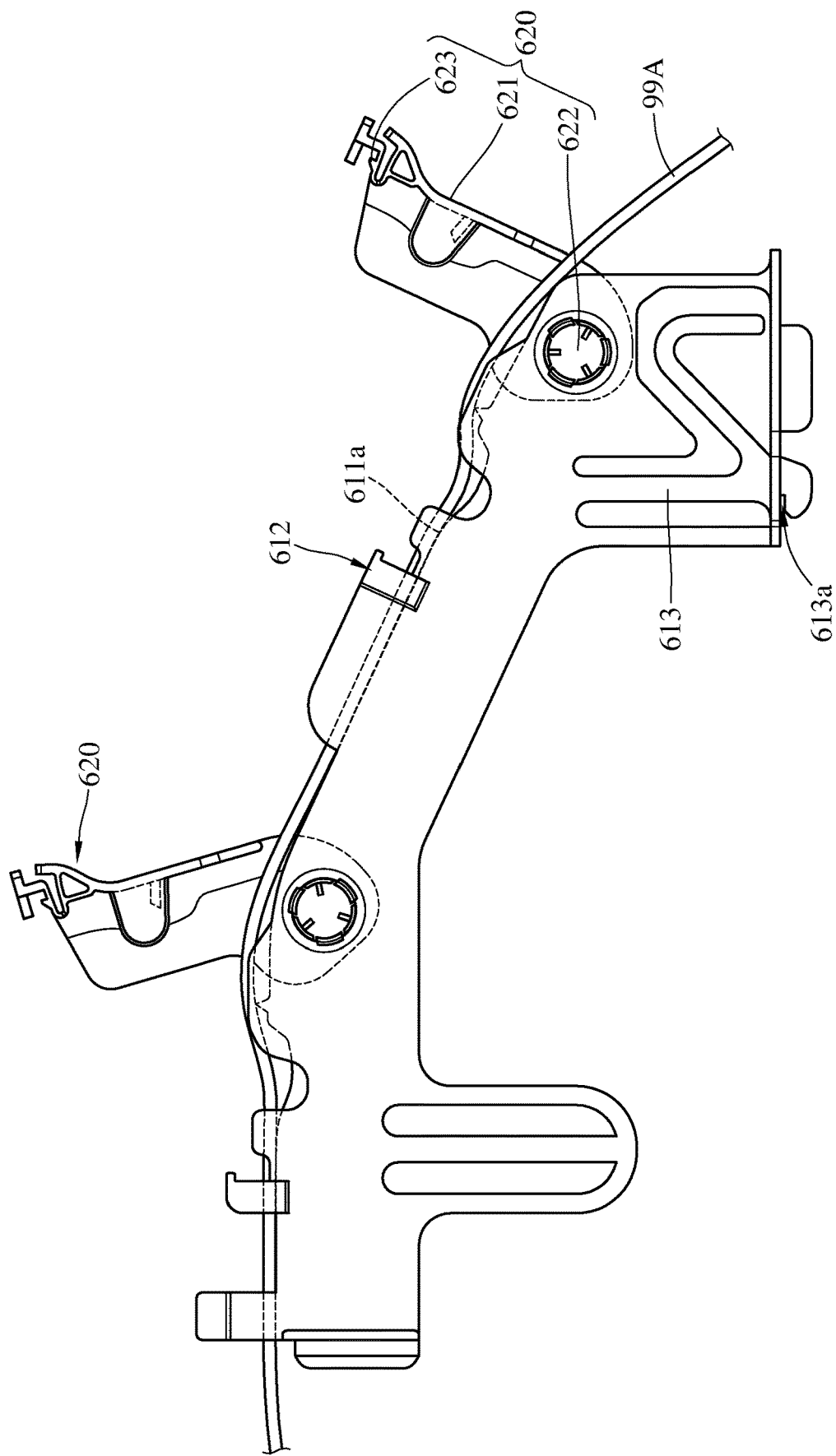
FIG. 13 is side view of the wire management module in FIG. 10 with the pivotal member at a releasing position.
Figure 14:
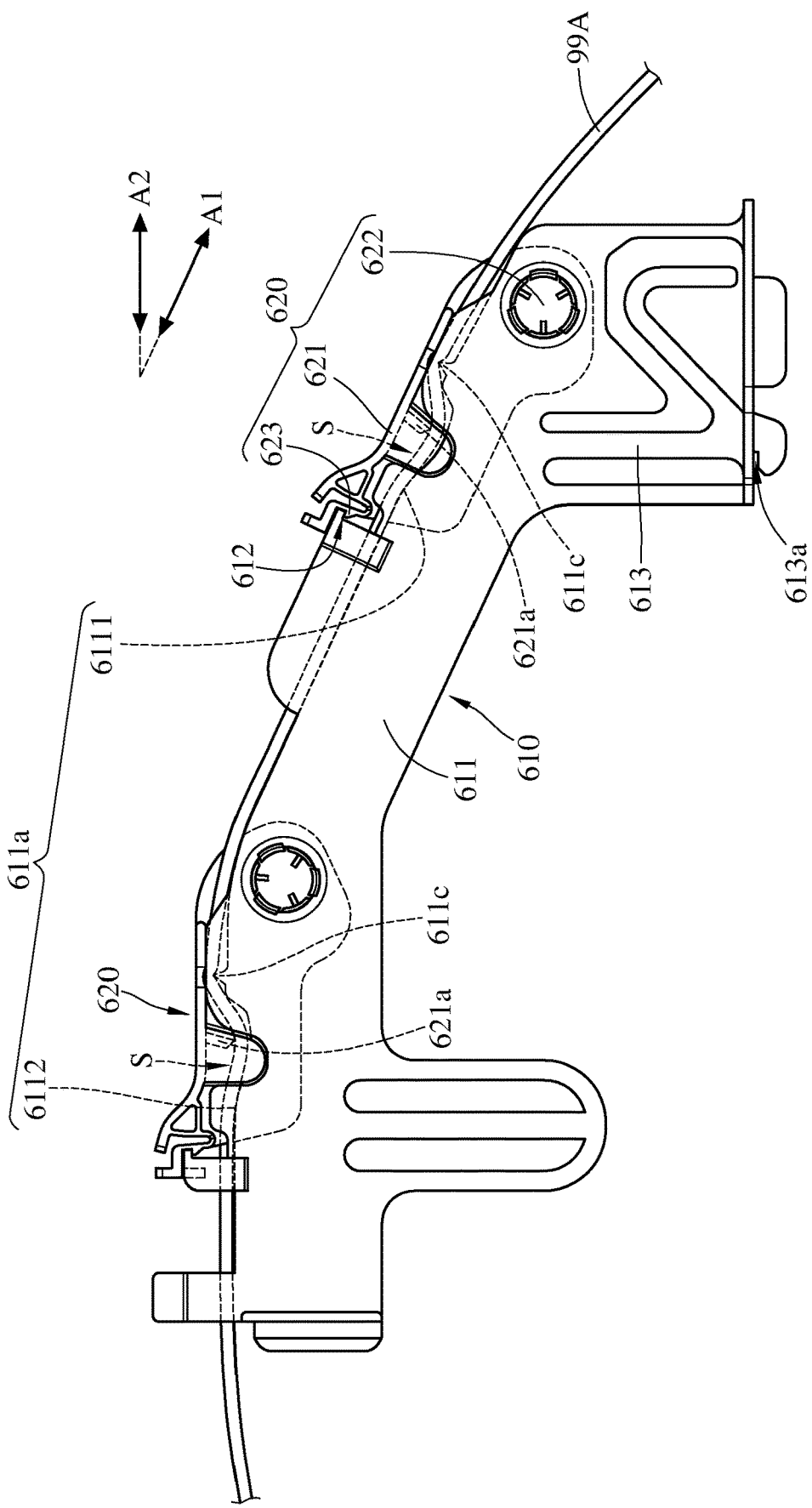
FIG. 14 is side view of the wire management module in FIG. 10 with the pivotal member at a fastening position.
Figure 15:
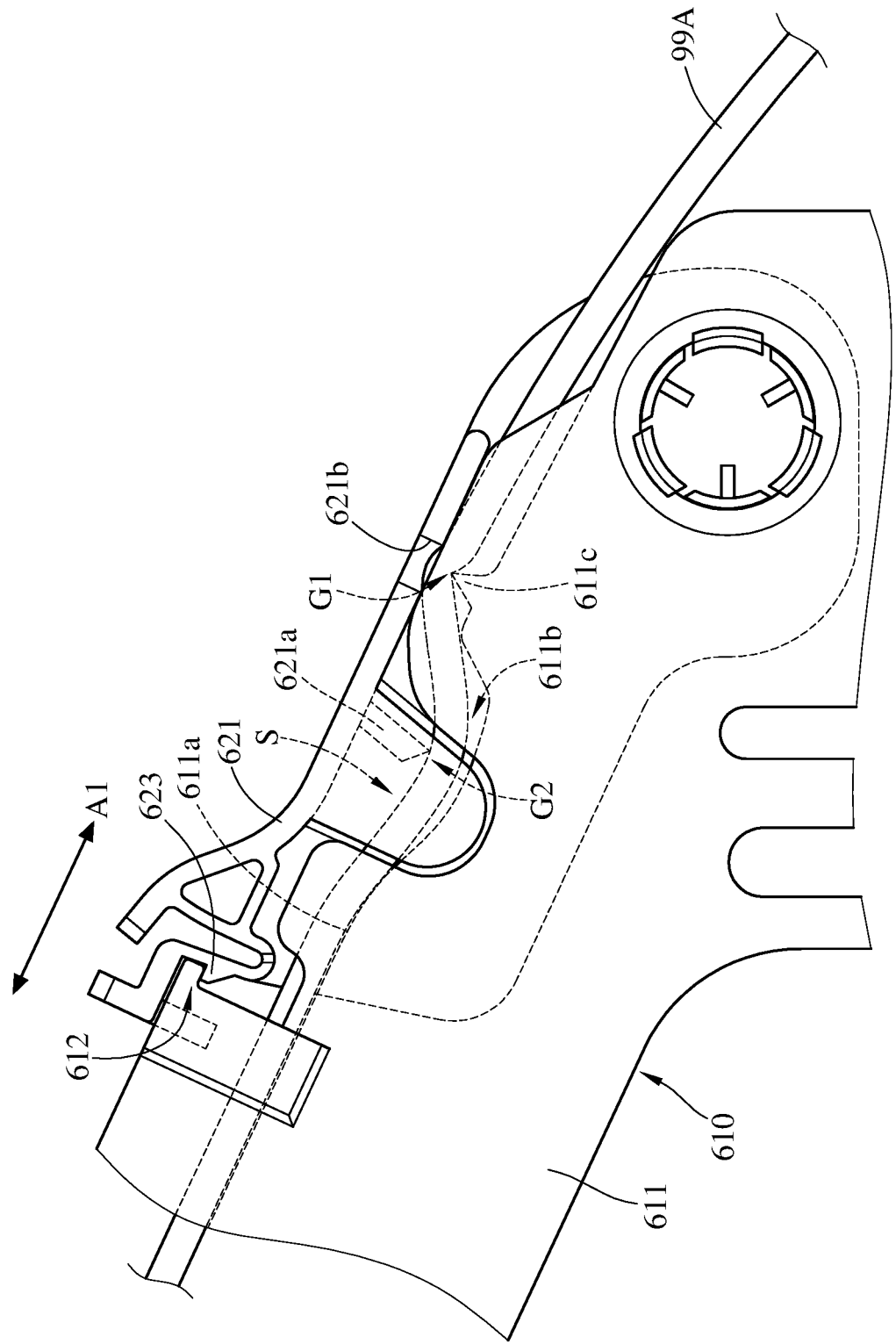
FIG. 15 is a partial side view of the wire management module in FIG. 14.

The pivotal member 620 is rotatable with respect to the partition 610 to be at either a releasing position and a fastening position. Please refer to FIG. 13 to FIG. 15. FIG. 13 is side view of the wire management module in FIG. 10 with the pivotal member at a releasing position. FIG. 14 is side view of the wire management module in FIG. 10 with the pivotal member at a fastening position. FIG. 15 is a partial side view of the wire management module in FIG. 14. As shown in FIG. 13, when the pivotal member 620 is in the releasing position, the fastening part 621 and the supporting surface 611a are spaced apart from each other. As shown in FIG. 12, FIG. 14, and FIG. 15 when the pivotal member 620 is in the fastening position, the fastening part 621 covers a part of the supporting surface 611a and defines a wire management space S between the fastening part 621 and the supporting surface 611a. The first bump 611c of the partition 610 and the second bump 621a of the pivotal member 620 are located in the wire management space S, and the first bump 611c and the second bump 621a are in staggered arrangement along an extension direction A1 of the supporting surface 611a. In detail, a projection of the first bump 611c is located on a right lateral surface of the second bump 621a along the extension direction A1 of the supporting surface 611a, and a projection of the second bump 621a is located on the left lateral surface of the first bump 611c along the extension direction A1 of the supporting surface 611a.

The cooperation of the partition 610 and the pivotal member 620 is favorable for arranging and accommodating wire. As shown in FIG. 13, when the pivotal member 620 is in the releasing position, a wire 99A is able to be placed on the supporting surface 611a. The wire 99A is, for example, a charging cord for charging a portable electronic device in the storage device 4. After the wire 99A is placed on the supporting surface 611a, the pivotal member 620 is rotated from the releasing position to the fastening position. As shown in FIG. 14 and FIG. 15, when the pivotal member 620 is in the fastening position, the fastening part 621 of the pivotal member 620 is close to the partitioning member 611 and covers a part of the supporting surface 611a so as to form the wire management space S. A part of the wire 99A is located in the wire management space S and clamped by the fastening part 621 and the first bump 611c of the partitioning member 611. In addition, the fixing part 623 of the pivotal member 620 is bent due to the interaction between the fixing part 623 and the fixing structure 612, and thus the fixing part 623 is fitted into a slot of the pivotal member 620 so as to be fixed to the fixing part 623. After the fixing part 623 is fixed to the fixing structure 612, the fixing part 623 is restricted and located between the fixing structure 612 and the partitioning member 611, thereby maintaining the pivotal member 620 to be in the fastening position.

When it is necessary to release the wire 99A, the fixing part 623 is released from the fixing structure 612, and then the pivotal member 620 is moved from the fastening position to the releasing position. In this time, the fastening part 621 of the pivotal member 620 and the supporting surface are spaced apart from each other, and the wire 99A is able to be moved with respect to the partition 610, such that the wire 99A is able to be adjusted or removed.

In a conventional wire management module of a storage device, fixing elements, which are configured to maintain the pivotal member in the fastening position, are disposed on an inner wall of a pivotal member and the lateral surface of a partition. In such a case, the fixing strength of the fixing elements are insufficient to fix the pivotal member under the requirement of compactness of the partition, and thus the pivotal member is easy to be detached from the fastening position by an external force. For example, when the wire is pulled, the wire may make the pivotal member easily detached from the fastening position. In order to solve the aforementioned problem, the fixing structure 612 of this embodiment is located on the top of the partitioning member 611, and the fixing part 623 of the pivotal member 620 is able to be fixed by the fixing structure 612 of the partition 610 to maintain the fixing part 623 to be located between the fixing structure 612 and the partitioning member 611, thereby maintaining the pivotal member 620 in the fastening position. As such, the fixing strength between the fixing structure 612 and the fixing part 623 is sufficient to prevent the pivotal member 620 from unpredictable detachment from the fastening position by the external force.

In the aforementioned conventional wire management module, the fixing strength for clamping the wire is insufficient, thus even though the pivotal member is in the fastening position, the wire is movable with respect to the wire management module when being pulled by a heavy force. In order to solve the aforementioned problem, when the pivotal member 620 of this embodiment is in the fastening position, the staggered arrangement of the first bump 611c and the second bump 621a makes the wire 99A bend in a gap G1 between the first bump 611c and the fastening part 621 and a gap G2 between the second bump 621a and the partitioning member 611, such that an interaction between the wire 99A and the wire management module 60 is produced and makes the wire 99A difficult to be moved.

The aforementioned conventional wire management module is only adapted to clamp single diameter of the wire. In order to improve the applications and the compatibility of the wire management module, a recess 611b of the partitioning member 611 is located on the supporting surface 611a, and the fastening part 621 has a through hole 621b in this embodiment. When the pivotal member 620 is in the fastening position, a part of the wire management space S is formed by the recess 611b and the fastening part 621, the through hole 621b exposes the first bump 611c of the partition 610, and the second bump 621a corresponds to the recess 611b. In this embodiment, the recess 611b makes the size of the gap G1 between the first bump 611c and the fastening part 621 unequal to the gap G2 between the second bump 621a and the partitioning member 611. In detail, the configuration of the recess 611b makes the gap G2 greater than the gap G1, thus the wire management module 60 is adapted to clamp wires having different diameters.

Figure 16:
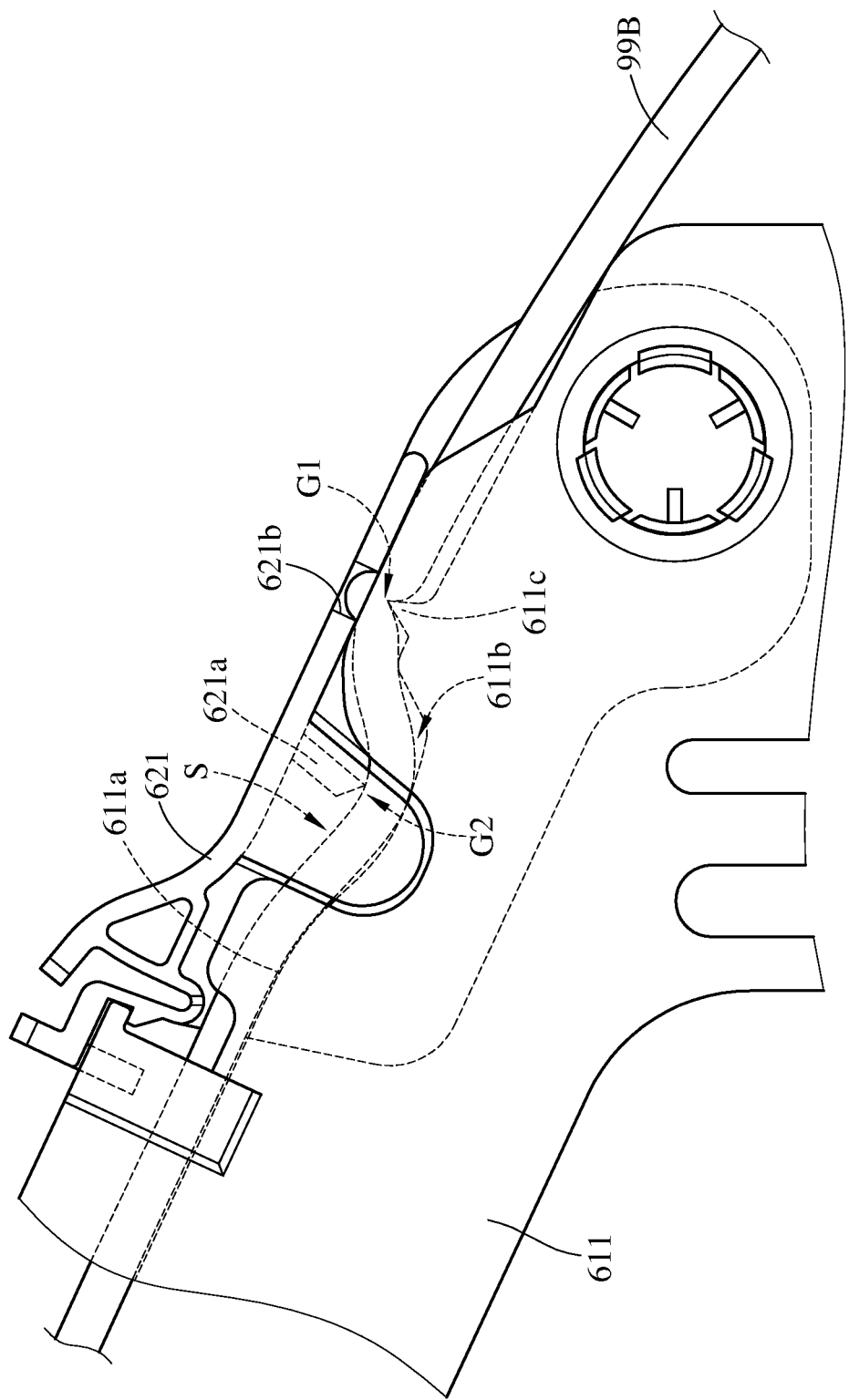
FIG. 16 is a partial side view of the wire management module in FIG. 14 while clamping a wire that has a greater diameter.

Please refer to FIG. 15 and FIG. 16. FIG. 15 is a partial side view of the wire management module in FIG. 14. FIG. 16 is a partial side view of the wire management module in FIG. 14 while clamping a wire that has a greater diameter. As shown in FIG. 15, when the wire management module 60 clamps a wire 99A which has a smaller diameter, the gap G1 between the first bump 611c and the fastening part 621 matches the wire 99A, thus the wire 99A is clamped by the fastening part 621 and the first bump 611c of the partitioning member 611. The gap G2 between the second bump 621a and the partitioning member 611 is greater than the diameter of the wire 99A. As shown in FIG. 7, when the wire management module 60 clamps a wire 99B which has greater diameter, the gap G2 matches the wire 99B, thus the wire 99B is clamped by the second bump 621a and the partitioning member 611. In addition, the gap G1 is smaller than the diameter of the wire 99B, thus a part of the wire 99B is located in the through hole 621b when the wire 99B clamped by the fastening part 621 and the first bump 611c, thereby preventing the first bump 611c and the fastening part 621 from overly squashing the wire 99B.

In addition, as shown in FIG. 14, in this embodiment, the supporting surface 611a of the partitioning member 611 has a first supporting part 6111 and a second supporting part 6112. A non-horizontal angle is between the extension direction A1 of the first supporting part 6111 and an extension direction A2 of the second supporting part 6112. In other words, the extension direction A1 and the extension direction A2 encloses an obtuse angle. When the two pivotal members 620 are in the fastening position, the two pivotal members 620 respectively cover the first supporting part 6111 and the second supporting part 6112. One pivotal member 620 and the first supporting part 6111 together forms a wire management space S, and the other pivotal member 620 and the second supporting part 6112 together forms the other wire management space S. As such, the non-horizontal angle between the first supporting part 6111 and the second supporting part 6112 is favorable for the wire 99A placed on the supporting surface 611a to be bent properly. Thus, when an external force is applied on the wire 99A along a direction parallel to the extension direction A1, only a small component force of the external force is effectively applied on a part of the wire 99A on the second supporting part 6112, thereby further preventing the wire 99A from unfavorable movement when pulling the wire 99A.

Figure 17:
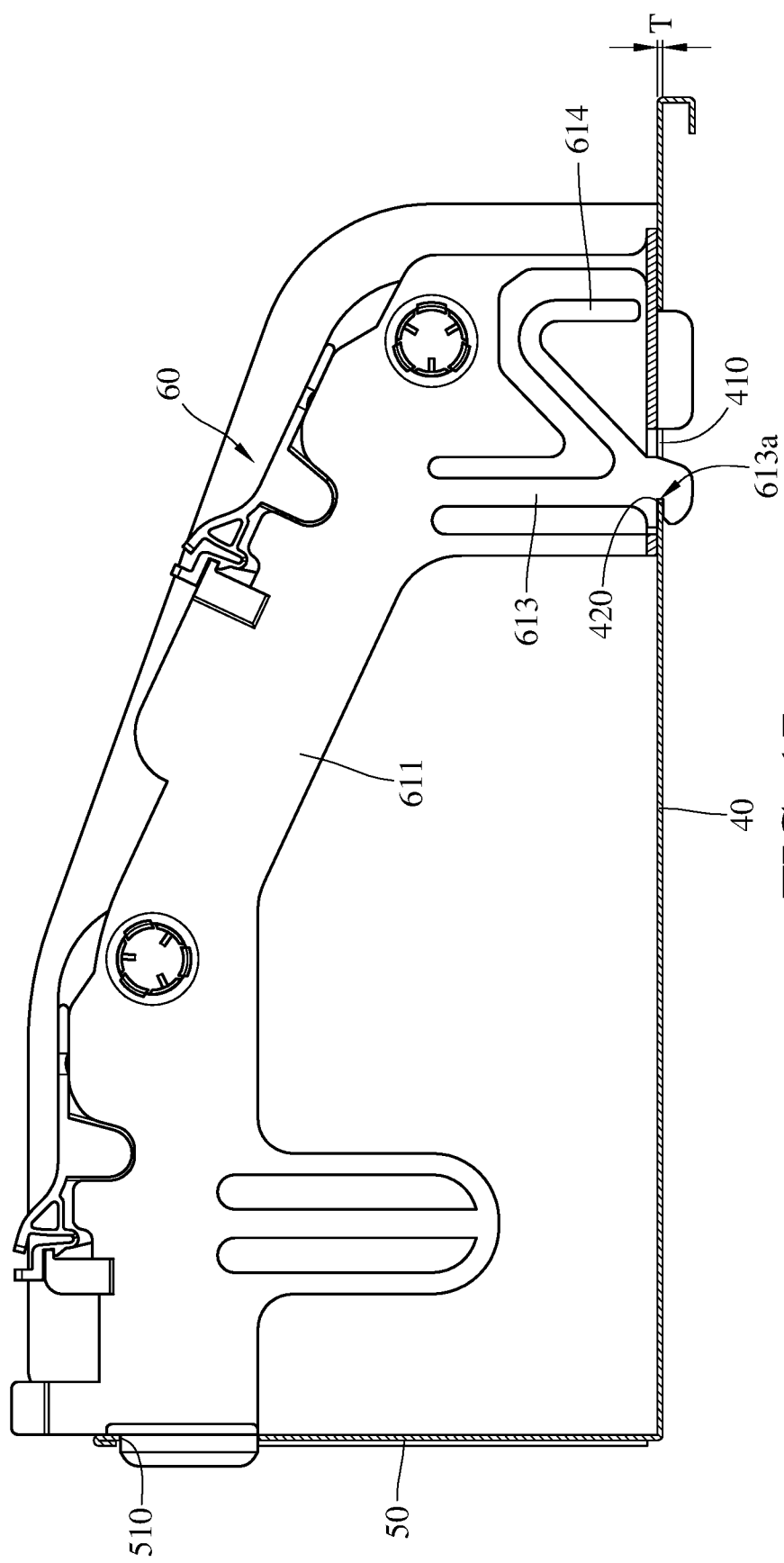
FIG. 17 is a side view of the storage device in FIG. 10.
Figure 18:
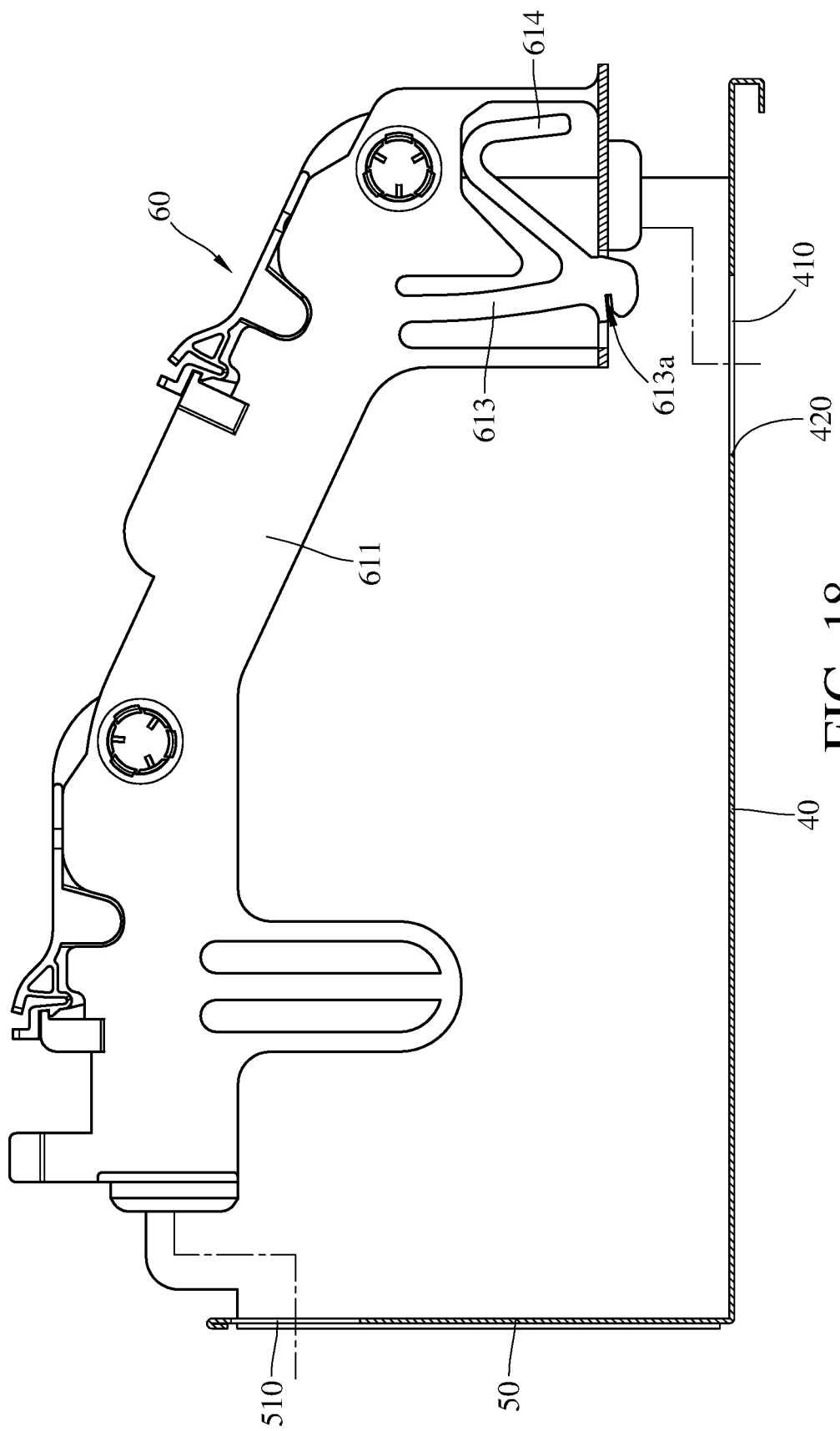
FIG. 18 is a side view of the wire management module in FIG. 17 while being detached from the base and the board.

The wire management module 60 is detachably disposed on the base 40 and the board 50. Please refer to FIG. 10, FIG. 17 and FIG. 18. FIG. 17 is a side view of the storage device in FIG. 10. FIG. 18 is a side view of the wire management module in FIG. 17 while being detached from the base and the board. When assembling the storage device 4, the partitioning member 611 of the partition 610 of the wire management module 60 is inserted into the fastening hole 510 of the board 50, and the assembling member 613 of the partition 610 is inserted into the slit 410. When the assembling member 613 is inserted into the slit 410, an edge 420 of the slit 410 faces the assembling slot 613a of the assembling member 613. In this embodiment, the width of the assembling slot 613a is equal to the thickness T of the base 40, such that the edge 420 is able to be fixed in the assembling slot 613a. In some other embodiments, the width of the assembling slot 613a may be greater than the thickness T of the base 40, such that the edge 420 is still able to be fixed in the assembling slot 613a.

When it is necessary to detach the wire management module 60, the holder 614 is pulled to move the assembling member 613 with respect to the partitioning member 611, such that the assembling slot 613a is detached from the edge 420. In this time, the partitioning member 611 is able to be moved to be detached from the slit 410 and the fastening hole 510, such that the wire management module 60 is disassembled with the base 40 and the board 50.

Figure 19:
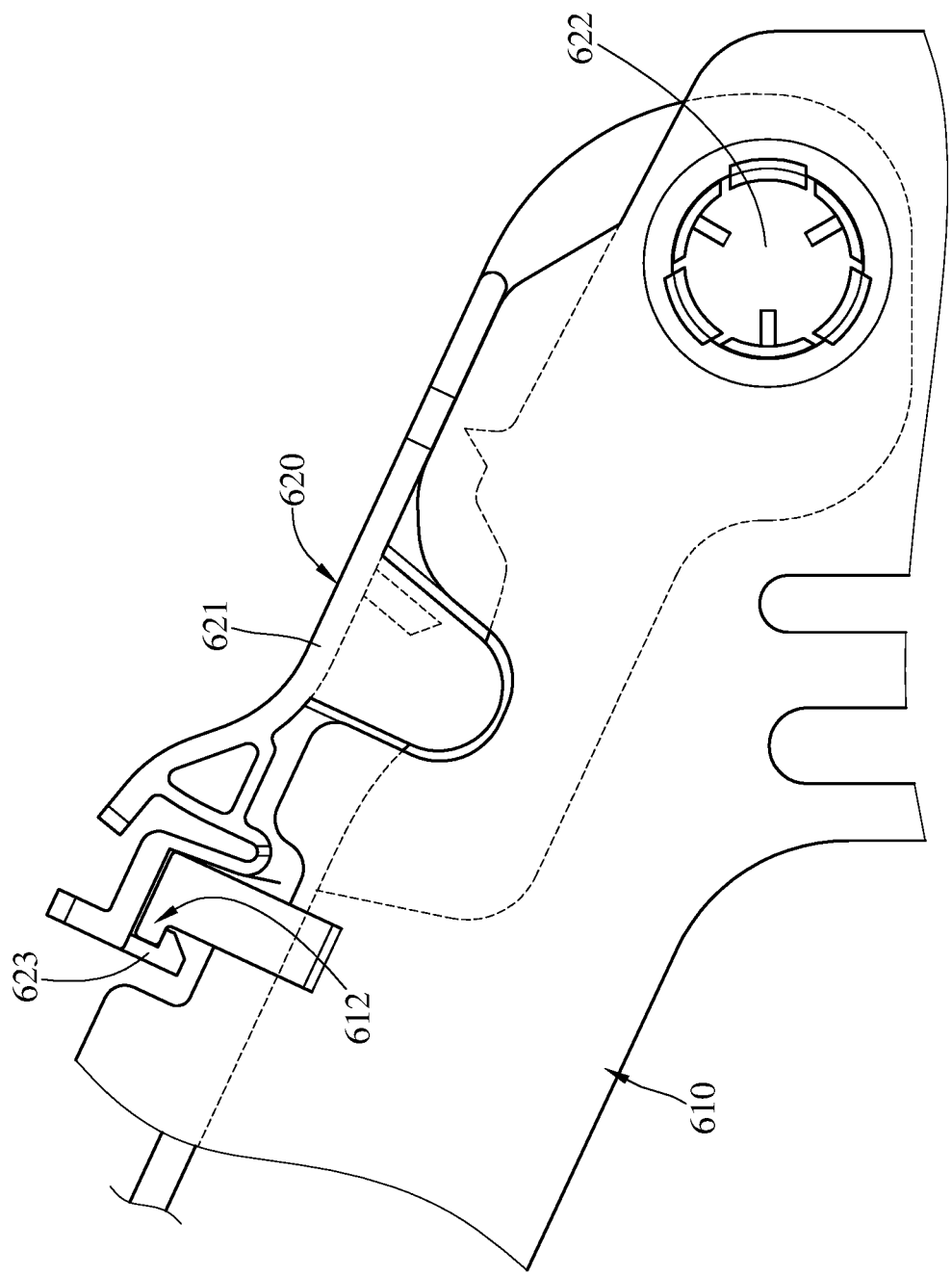
FIG. 19 is a partial side view of a wire management module of a storage device according to a fifth embodiment.

The fixing structure of the wire management module is not limited in the fourth embodiment. Please refer to FIG. 19. FIG. 19 is a partial side view of a wire management module of a storage device according to a fifth embodiment. Since the fifth embodiment is similar to the fourth embodiment, only the differences will be illustrated hereinafter. Comparing with the fourth embodiment in FIG. 15, the location, where the fixing part 623 of the pivotal member 620 is fixed to the fixing structure 612 of the partition 610, is far away from the pivotal part 622 of the pivotal member 620.

Figure 20:
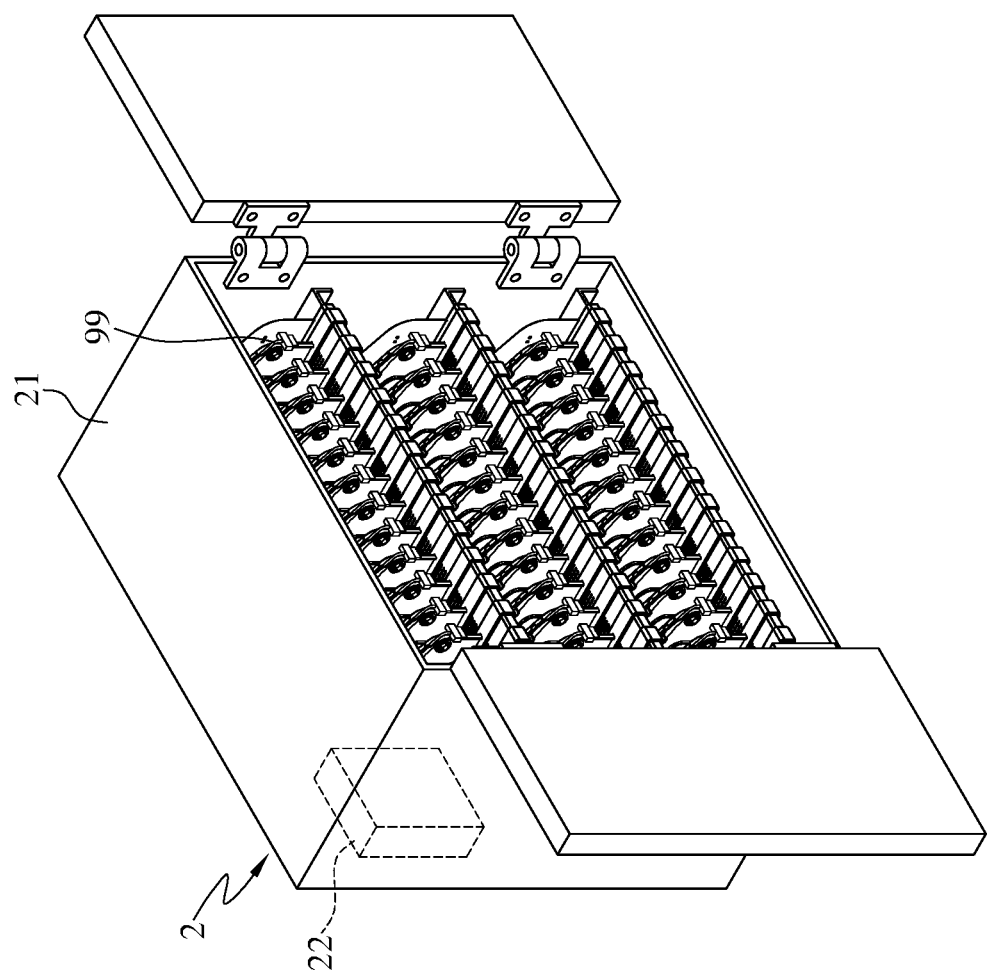
FIG. 20 is a perspective view of a charge cabinet according to a sixth embodiment.

The storage device may be applicable to a charge cabinet. Please refer to FIG. 20. FIG. 20 is a perspective view of a charge cabinet according to a sixth embodiment. In this embodiment, the charge cabinet 2 includes at least one storage device according to one of the embodiment of the disclosure, a case 21, a power supply 22 and a plurality of wires 99. The case 21, for example, is a frame of the charge cabinet 2. The power supply 22 may be disposed on an outer surface of the case 21 or disposed in the case 21. Two ends of the wires 99 may be respectively electrically connected to the power supply 22 and a port of an electronic device (not shown in the drawing). The storage device may be disposed in the case 21. The wire 99, for example, is a cable for charging the electronic device disposed in the accommodation space of the storage device. The base and the board of the storage device can be integrated formed with the case 21 as a single member.

According to the disclosure, the wire management groove formed on the partition so that it is favorable for positioning the wire at a one side of the partition. After the wire is accommodated in the wire management groove, the pivotal member is rotatable for fastening the wire between the supporting surface of the partition and the fastening part of the pivotal member. Therefore, the position of the wire on the partition is fixed, and thereby preventing the wire from becoming tangled and being difficult to plug into the port of the mobile electronic device.

Furthermore, a space formed by the first limiting section and the supporting section is favorable for accommodating the wire having larger diameter, and a space formed by the second limiting section and the bottom surface is favorable for accommodating the wire having a smaller diameter, and thereby the wire management groove is applicable to accommodate different wires having different diameters.

Moreover, the assembling member of the partition is detachably assembled together with the base, and the protrusion of the partition is detachably fastened into the fastening hole of the board. Two different ends of the wire management module are respectively fixed to the base and the board by the assembling member and the protrusion. Therefore, the distance between every two of the wire management modules that are adjacent to each other is adjustable, and the quantity of the wire management module assembled together with the base and the board is also adjustable.

In addition, when the pivotal member is moved from the fastening position to the releasing position, the extension part is abutted against the blocking section so as to stop the rotation of the pivotal member relative to the partition. Thus, the arrangement of the blocking section and the extension part is favorable for maintaining an angle between the pivotal member and the base when the pivotal member is at the releasing position so that the angles between each of the pivotal members and the base are the same, and thereby it is favorable for providing better overall appearance of the storage device. Moreover, the pivotal member is capable of being kept at the releasing position by the blocking section and the extension part without supported by hand so that the user is able to replace and organize the wire on the supporting surface with two hands.

In addition, the arrangement of the fixing block and the positioning hole is favorable for preventing the pivotal member from being move away from the fastening position so as to maintain sufficient capability for fastening the wire.

In some other embodiment, when pivotal member is in the fastening position, the fixing part of the pivotal member is fixed to the fixing structure of the partition and located between the fixing structure and the partitioning member, thereby maintaining the pivotal member in the fastening position. As such, the fixing strength between the fixing structure and the fixing part is sufficient to prevent the pivotal member from unpredictable detachment from the fastening position by the external force In addition, when the pivotal member is in the fastening position, the staggered arrangement of the first bump and the second bump makes the wire bend in a gap between the first bump and the fastening part and a gap between the second bump and the partitioning member, such that an interaction between the wire and the wire management module is produced and makes the wire difficult to be moved.

The foregoing description, for the purpose of explanation, has been described with reference to specific embodiments; however. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the disclosure to the precise forms disclosed. Modifications and variations are possible in view of the above teachings.

What is claimed is:

1. A storage device, comprising:
a base; and
a wire management module comprising:
 a partition disposed to the base, the partition and the base together defining a plurality of accommodation spaces, a supporting surface of the partition being located at a side of the partition away from the base, and a first bump of the partition being located on the supporting surface; and at least one pivotal member comprising a fastening part and a pivotal part connected to each other, the pivotal part being pivoted on the partition, a second bump of the fastening part being located at a side of the fastening part close to the supporting surface, and the at least one pivotal member being rotatable with respect to the partition to be at either a fastening position or a releasing position;

wherein, when the at least one pivotal member is in the fastening position, the fastening part covers a part of the supporting surface and defines a wire management space, the first bump and the second bump are located in the wire management space, and the first bump and the second bump are in staggered arrangement along an extension direction of the supporting surface; when the at least one pivotal member is in the releasing position, the fastening part and the supporting surface are spaced apart from each other.

2. The storage device according to claim 1, wherein a projection of the first bump along the extension direction of the supporting surface is located on the second bump.

3. The storage device according to claim 1, wherein a recess of the partition is located on the supporting surface, when the at least one pivotal member is in the fastening position, the recess and the fastening part together defines a part of the wire management space, the second bump corresponds to the recess, and size of a gap between the first bump and the fastening part is unequal to size of a gap between the second bump and the partition.

4. The storage device according to claim 1, wherein when the at least one pivotal member is in the fastening position, a through hole of the fastening part exposes the first bump.

5. The storage device according to claim 1, wherein a quantity of the at least one pivotal member is two, the supporting surface has a first supporting part and a second supporting part, a non-horizontal angle is between an extension direction of the first supporting part and an extension direction of the second supporting part; when the two pivotal members are in the fastening position, the two pivotal members respectively cover the first supporting part and the second supporting part.

6. A charge cabinet comprising:
a case;
a power supply disposed to the case; and
the storage device according to claim 1, disposed to the case.

7. A storage device, comprising:
a base; and
a wire management module comprising:
a partition disposed to the base and comprising a partitioning member and a fixing structure connected to each other, the partitioning member and the base together defining a plurality of accommodation spaces, and a supporting surface of the partitioning member being located at a side of the partitioning member away from the base; and
a pivotal member comprising a fastening part, a pivotal part and a fixing part connected to each other, the pivotal part being pivoted on the partitioning member, the fixing part corresponding to the fixing structure, and the pivotal member being rotatable with respect to the partition to be at either a fastening position or a releasing position;

wherein, when the pivotal member is in the fastening position, the fastening part covers a part of the supporting surface and defines a wire management space, the fixing part of the pivotal member is located between the fixing structure and the partitioning member of the partition, and the fixing part is fixed to the fixing structure so as to maintain the pivotal member in the fastening position; when the pivotal member is in the releasing position, the fastening part and the supporting surface are spaced apart from each other, and the fixing part is released from the fixing structure of the partition.

8. The storage device according to claim 7, wherein the partition further comprises an assembling member movably connected to the partitioning member, and the assembling member is detachably fixed to an edge of the base.

9. The storage device according to claim 8, wherein an assembling slot of the assembling member faces the edge of the base, the assembling member is fixed to the base through the assembling slot, and a width of the assembling slot is greater or equal to a thickness of the base.

10. The storage device according to claim 9, wherein the partition further comprises a holder which is connected to the assembling member, the assembling slot and the holder are respectively located on two sides of the assembling member opposite to each other, and the assembling member and the holder are together movable with respect to the partitioning member.

11. A charge cabinet comprising:
a case;
a power supply disposed to the case; and
the storage device according to claim 10, disposed to the case.

* * * * *